(12) United States Patent
Morita et al.

(10) Patent No.: US 7,889,017 B2
(45) Date of Patent: Feb. 15, 2011

(54) RESONATOR, OSCILLATOR AND COMMUNICATION DEVICE

(75) Inventors: Shinya Morita, Kanagawa (JP); Akira Akiba, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/235,710

(22) Filed: Sep. 23, 2008

(65) Prior Publication Data
US 2009/0085683 A1 Apr. 2, 2009

(30) Foreign Application Priority Data
Sep. 28, 2007 (JP) ............................ P2007-255864

(51) Int. Cl.
*H03B 5/30* (2006.01)
(52) U.S. Cl. ..................... 331/156; 331/56; 331/116 M
(58) Field of Classification Search ................... 331/56, 331/116 M, 156, 107 DP
See application file for complete search history.

(56) References Cited

U.S. PATENT DOCUMENTS

| 6,249,073 | B1 | 6/2001 | Nguyen et al. |
| 6,859,113 | B2 * | 2/2005 | Giousouf et al. ......... 331/116 M |
| 7,352,254 | B2 * | 4/2008 | Tanaka .................. 331/116 M |

FOREIGN PATENT DOCUMENTS

JP  2006-033740  2/2006

* cited by examiner

*Primary Examiner*—Robert Pascal
*Assistant Examiner*—James E Goodley
(74) *Attorney, Agent, or Firm*—SNR Denton US LLP

(57) ABSTRACT

A resonator containing a plurality of resonator elements, respectively having an electrode and an oscillating component opposed while having a space in between, arranged so as to form a closed system. The oscillating component of the plurality of resonator elements is continuously formed in an integrated manner.

20 Claims, 28 Drawing Sheets

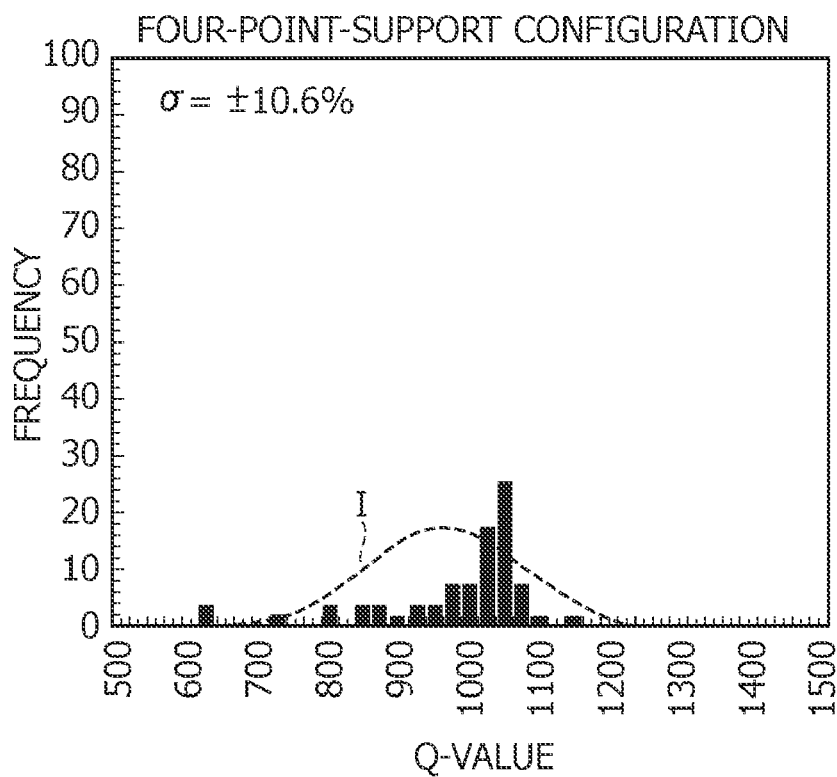
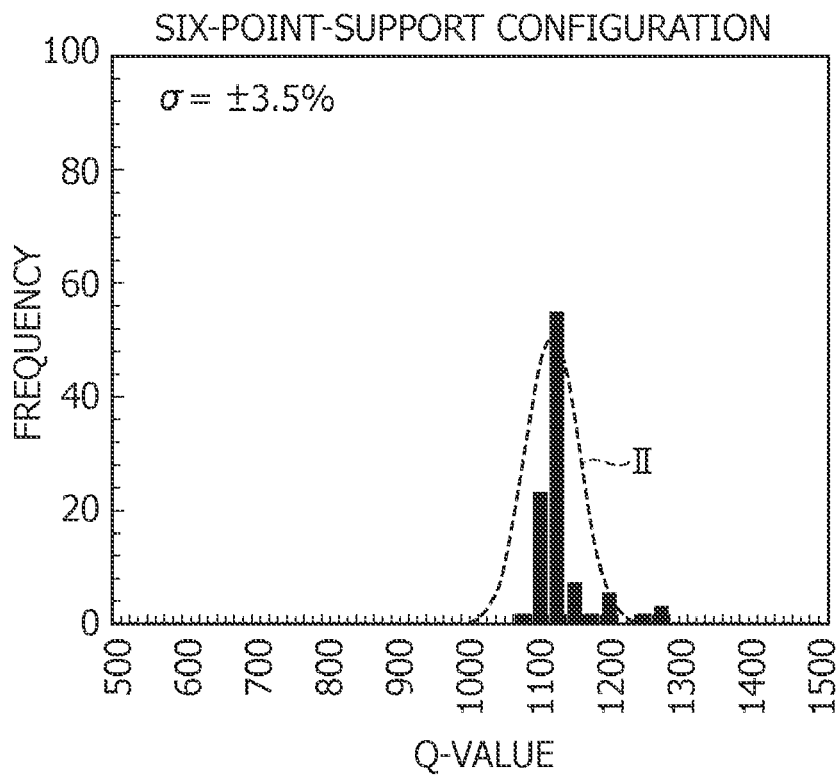

FIG. 25A
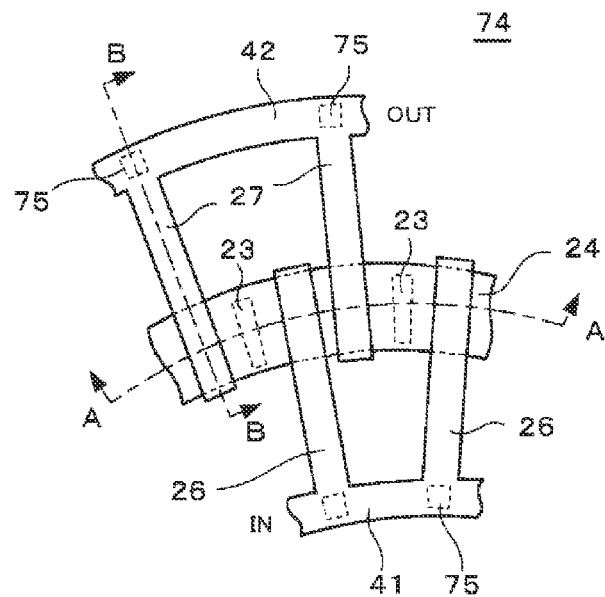
FIG. 25B A-A SECTION
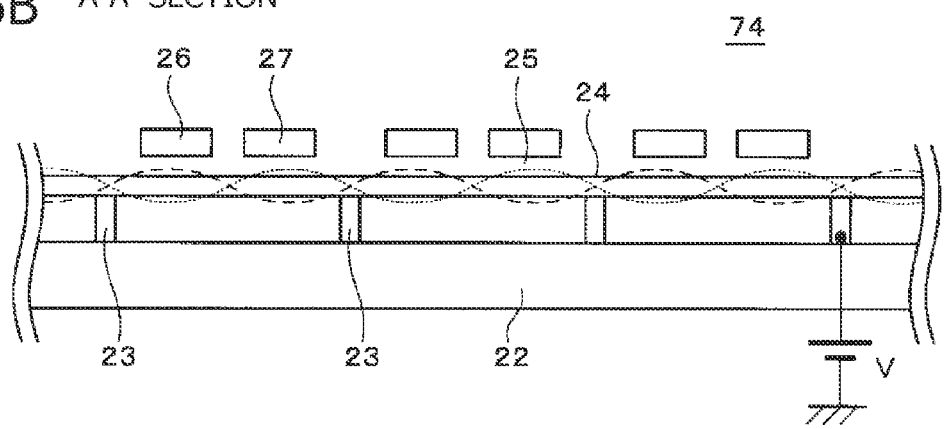
FIG. 25C B-B SECTION
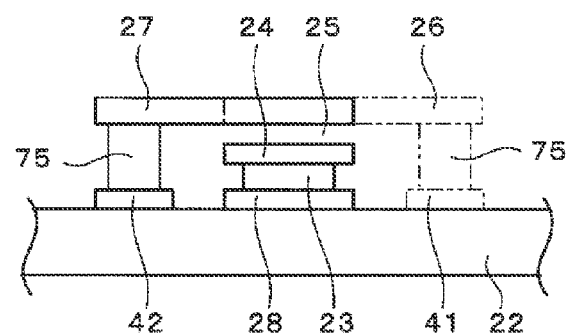

FIG. 26A
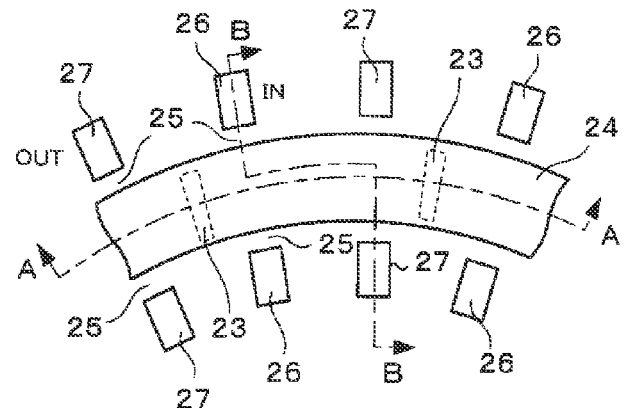
FIG. 26B  A-A SECTION
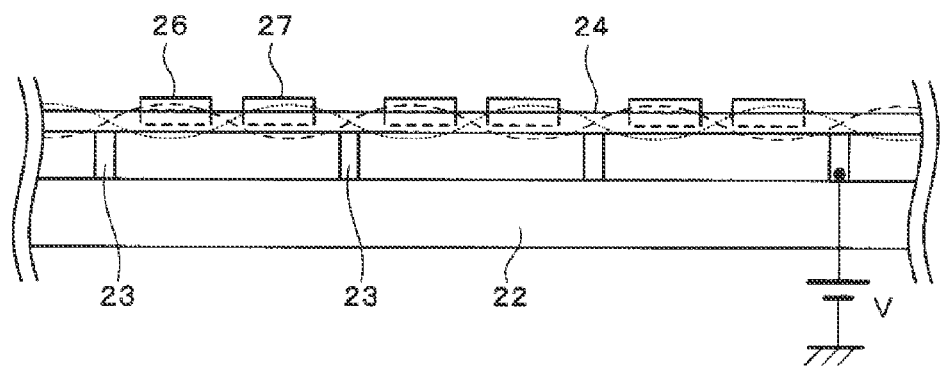
FIG. 26C  B-B SECTION
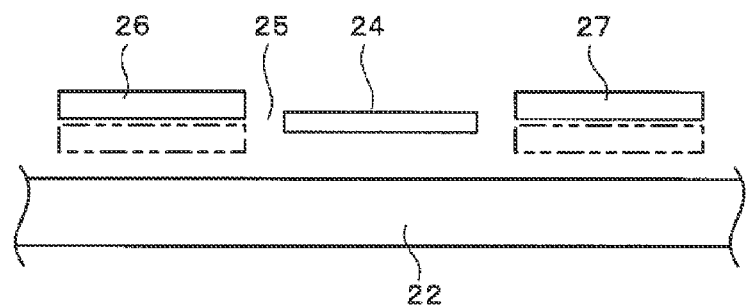

FIG. 28A
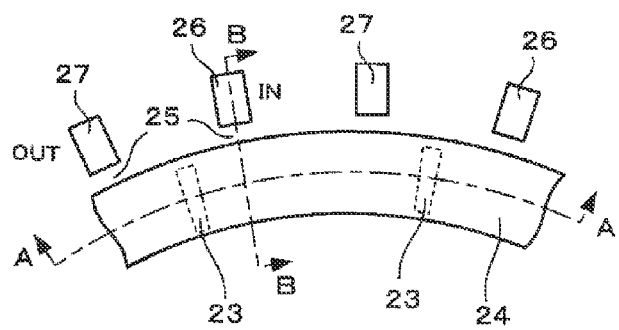
FIG. 28B  A-A SECTION
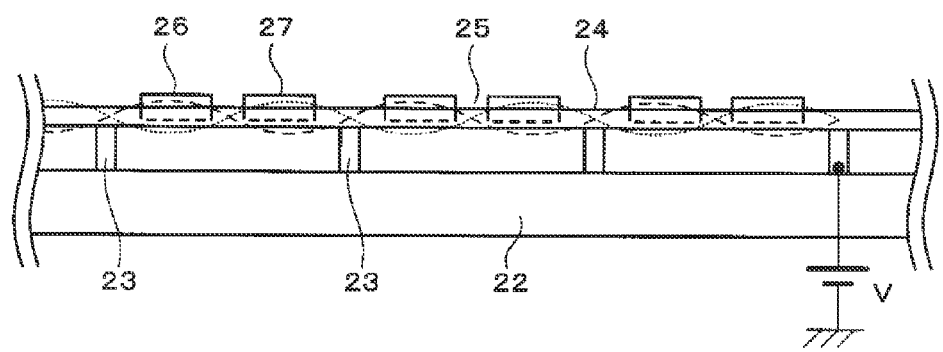
FIG. 28C  B-B SECTION
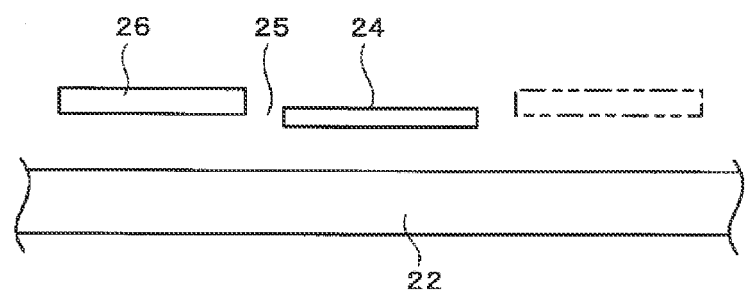

FIG. 29A
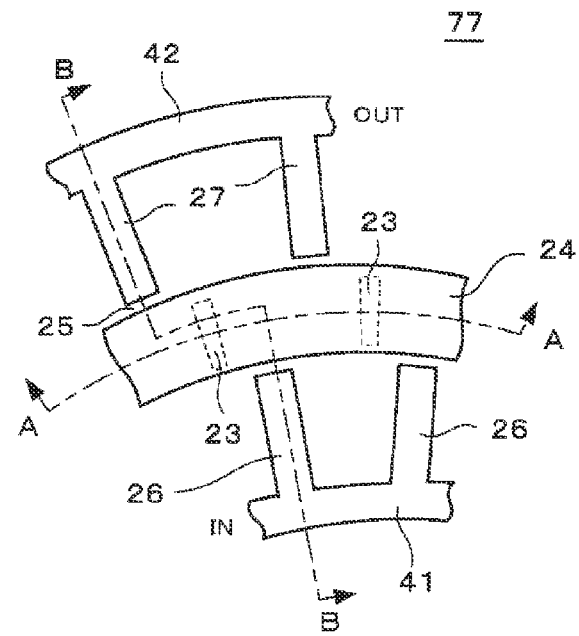
FIG. 29B  A-A SECTION
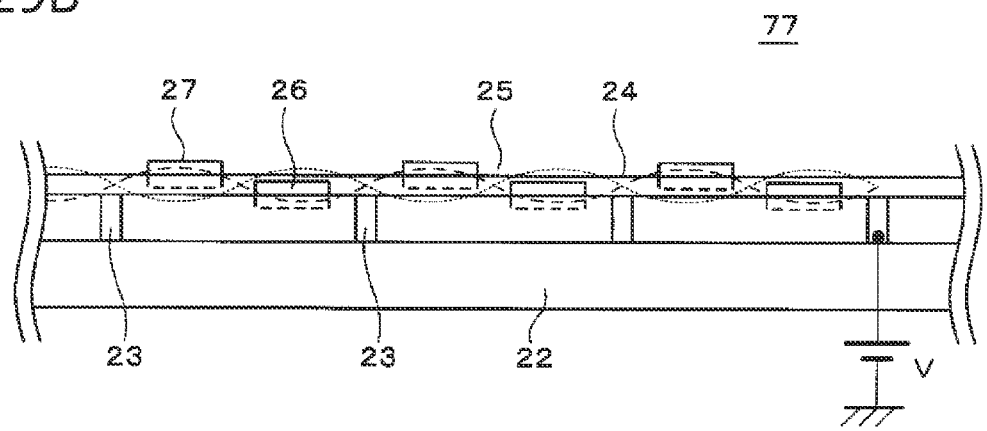
FIG. 29C  B-B SECTION
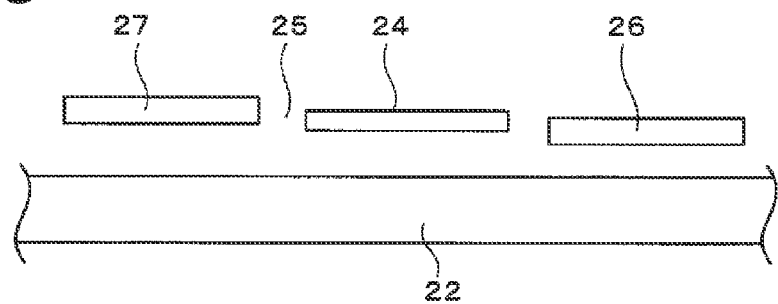

RESONATOR, OSCILLATOR AND COMMUNICATION DEVICE

CROSS-REFERENCE TO RELATED APPLICATIONS

The present document contains subject matter related to Japanese Patent Application No. 2007-255864 filed in the Japanese Patent Office on Sep. 28, 2007, the entire content of which being incorporated herein by reference.

BACKGROUND OF THE INVENTION

1. Field of the Invention

The present invention relates to a resonator making use of mechanical resonance, an oscillator using the resonator, and a communication device provided with the oscillator.

2. Description of the Related Art

With recent advancement in wireless communication technology, communication instruments using the wireless communication technology are requested to reduce their size and weight. Micro-electromechanical system (MEMS) technology, capable of fabricating fine mechanical structures based on micro-processing technology used for semiconductor processing, has been adopted for processing of RF signal processor unit which has been difficult to downsize.

As one example, mechanical resonator making use of mechanical resonance is known. RF elements using the mechanical resonator, such as filter, oscillator and mixer, are expected to be applied to the field of communication, because they are small in size and can be integrated. Japanese Patent Application Publication No. JP 2006-33740 (Patent Document 1) and U.S. Pat. No. 6,249,073 (Patent Document 2) disclose technologies of mechanical resonators.

Small insertion loss and high Q-value of resonator are required for fabricating an oscillator by use of the resonator. Since the mechanical resonator has high impedance, it is necessary to connect the same resonating elements in parallel, that is, to lower the impedance by parallel connection, whereas the parallel connection results in decrease in the Q-value of resonator.

SUMMARY OF THE INVENTION

There are two possible reasons for lowering the Q-value of parallel resonators by use of mechanical oscillation: (1) variation in characteristics of the individual unit resonator elements in the parallel resonator; and (2) leakage of kinetic energy of the oscillating component through support components to a substrate. Reason (2) applies also to a single-unit resonator. The two reasons will be explained.

The reason (1) will be described in details. For the purpose of reducing the insertion loss of mechanical resonator, it may be necessary to connect the same resonator elements in parallel to lower the impedance. One possible way of parallel connection of unit resonators may be, generally as shown in FIGS. 35A and 35B, such that a plurality of resonator elements are arranged in a grid array pattern for parallel connection. A parallel resonator 1 shown in FIGS. 35A and 35B is configured by arranging a unit resonator element 2 shown in FIG. 36 in an array pattern.

The resonator element 2 is configured, as shown in FIG. 36, by forming an input electrode (so-called input signal line) 4 and an output electrode (so-called output signal line) 5 on a substrate 3, and arranging an oscillating component (so-called beam) 7 as being supported aerially over the input/output electrodes 4, 5 while keeping a space 6 in between. The oscillating component 7 is configured such that both ends thereof are supported by support components 8 [8A, 8B] on an interconnect layer 9 and cross with the input/output electrodes 4, 5. The parallel resonator 1 is configured, as shown in FIGS. 35A and 35B, as arranging a plurality of resonator elements 2 (see FIG. 36) in an array pattern on the common substrate 3, connecting the support components 8A, 8B of the oscillating component 7 at an electroconductive pedestal 9 per a line, and connecting the individual oscillating components 7 in common by connecting the pedestals 9 on the last end per a line. The oscillating component 7 is supplied with DC bias voltage V. On the other hand, the input electrode 4 with the input electrode 4, and the output electrode 5 with the output electrode 5, which arranged as being crossed with the oscillating component 7, are connected in common.

In view of oscillating characteristics in the configuration shown in FIG. 35, the individual resonator elements 2 are varied in oscillation frequency, when compared between the outer circumferential region and center region of the array. There are two possible reasons for the variation in resonance frequency. The one of reason is that stress posed on the oscillating component (so-called oscillating component 7) differs between the center region and outer circumferential region, and the other is that structural variation in film thickness, or the like (in particular, film thickness of oscillating component), tends to occur at the center portion and the outer circumferential portion of the array, in the process of fabricating the resonator element 2.

For the reasons, any distribution in the number of waves in the parallel resonator 1 may lower the Q-value as compared with that of a single resonator. In order to avoid lowering in the Q-value caused when the parallel arrangement is performed, it may be necessary to reduce variation in the resonance frequency in the parallel resonator. However, for the case where the resonator elements 2 are arranged in an array pattern, it has been difficult to exclude difference in stress with respect to the oscillating component, and the structural variation in the resonator elements.

The reason (2) will be described in details. In order to improve the Q-value of the resonator, it is important to avoid leakage of kinetic energy of the oscillating component to the substrate. In the resonator elements 2 arranged according to the array pattern, the individual oscillating components 7 are supported by the support component 8 [8A, 8B] in a manner the individual oscillating components 7 are separated from the oscillating component 7 of adjacent resonator element 2 (see FIG. 35B). Therefore, a part of kinetic energy of oscillation of the individual resonator elements 2 may leak through the support component 8 [8A, 8B] to the substrate 3, and whereby the Q-value may be degraded.

The present invention is conceived after considering the above-described situation, and is to provide a parallel resonator improved in the Q-value by equalizing structure of the individual resonator elements and stress applied to the individual resonator elements.

The present invention is to provide also an oscillator using the above-described resonator, and a communication device provided with the oscillator.

According to embodiments of the present invention, there is provided a resonator containing a plurality of resonator elements, respectively having electrodes and an oscillating component opposed while keeping a space in between, arranged so as to form a closed system, in which the oscillating component of the plurality of resonator elements is continuously formed in an integrated manner.

In the resonator of the present invention configured as a parallel resonator having a plurality of resonator elements connected therein, the plurality of resonator elements are arranged so as to form a closed system, and an oscillating component of the plurality of resonator elements are continuously formed in an integrated manner, so that the structure of the individual resonator elements is equalized, and stress applied to the oscillating component of the individual resonator elements is equalized.

According to the present invention, there is provided also an oscillator configured by using a resonator, the resonator containing a plurality of resonator elements, respectively having electrodes and an oscillating component opposed while keeping a space in between, arranged so as to form a closed system, wherein the oscillating component of the plurality of resonator elements is continuously formed in an integrated manner.

The oscillator of the present invention is configured using a parallel resonator which contains the plurality of resonator elements arranged so as to form a closed system, and has the oscillating component of the plurality of resonators continuously formed in an integrated manner, so that the structure of the individual resonator elements in the parallel resonator is equalized, and stress applied to the oscillating component of the individual resonator elements is equalized, thereby excellent oscillator characteristics may be obtained.

According to the present invention, there is provided a communication device having an oscillator circuit for frequency conversion, configured using an oscillator, the oscillator containing a plurality of resonator elements, respectively having electrodes and an oscillating component and being arranged so as to form a closed system, wherein the oscillating component of the plurality of resonator elements is continuously formed in an integrated manner.

The communication device of the present invention uses the above-described oscillator configured as the parallel resonator, so that excellent characteristics may be obtained.

According to the resonator of the present invention, there is provided a parallel resonator having a large Q-value. According to the oscillator of the present invention, there is provided an oscillator having high frequency stability.

According to the communication device of the present invention, there is provided a communication device ensuring excellent oscillator characteristics and high reliability.

BRIEF DESCRIPTION OF THE DRAWINGS

FIG. 22 is a graph of Q-value for a four-point-support configuration for explaining the present invention;

FIG. 23 is a graph of Q-value for a six-point-support configuration for explaining the present invention;

FIGS. 25A, 25B and 25C are a schematic plan view, a sectional view taken along line A-A therein, and a sectional view taken along line B-B therein, respectively, of a main portion of an eighth embodiment of the resonator of the present invention;

FIGS. 26A, 26B and 26C are a schematic plan view, a sectional view taken along line A-A therein, and a sectional view taken along line B-B therein, respectively, of a main portion of a ninth embodiment of the resonator of the present invention;

FIGS. 28A, 28B and 28C are a schematic plan view, a sectional view taken along line A-A therein, and a sectional view taken along line B-B therein, respectively, showing a main portion of a tenth embodiment of the resonator of the present invention;

FIGS. 29A, 29B and 29C are a schematic plan view, a sectional view taken along line A-A therein, and a sectional view taken along line B-B therein, respectively, showing a main portion of an eleventh embodiment of the resonator of the present invention;

DETAILED DESCRIPTION OF THE EMBODIMENTS

Figure 1A:
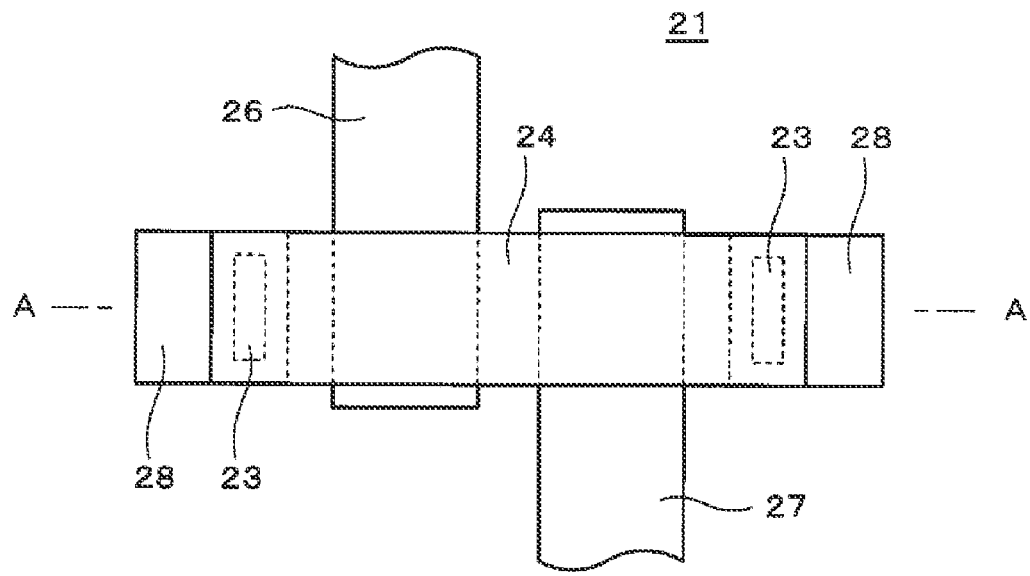
FIGS. 1A and 1B are a plan view and a sectional view taken along line A-A, respectively, of an exemplary unit resonator element adopted to a resonator of an embodiment of the present invention.

Paragraphs below will explain embodiments of the present invention, referring to the drawings.

Figure 1B:
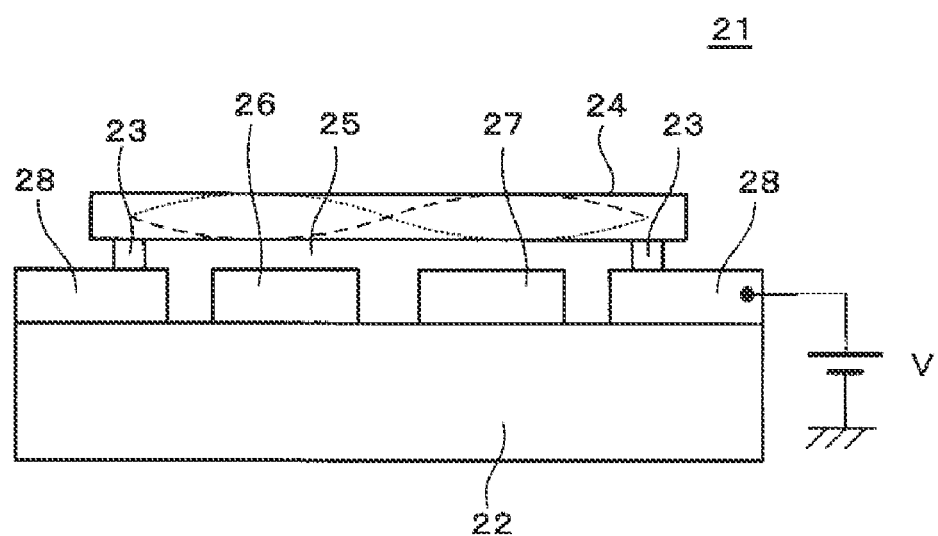

First, a configuration and a principle of operation of a single unit of resonator element composing a resonator of this embodiment will be explained, referring to FIGS. 1A and 1B. The resonator element to be brought into focus in this embodiment is a micro-resonator element of micro scale and nano scale. A resonator element 21 exemplified in this embodiment is a mechanical resonator element having an oscillating component (so-called beam) 24 which functions as oscillator and is held aerially over the substrate 22 with the aid of support components 23 at both ends thereof, and an input electrode (so-called input signal line) 26 and an output electrode (so-called output signal line) 27, which serve as the lower electrodes, fixed on the substrate 22 such that the electrodes cross the oscillating component 24 while keeping a space 25 in between, as described previously. Support components 23 are formed as being connected to electroconductive pedestals 28 on the substrate 22.

The resonator element 21 oscillates at a resonance frequency specific to the oscillating component 24, when a signal inputted from the input electrode 26 induces external force based on electrostatic force to the oscillating component 24 to which direct-current (DC) bias voltage V is applied, and the oscillation is transmitted as a signal via the micro space 25 to the output electrode 27. The resonator element 21 is a resonator element making use of flexural oscillation of the secondary mode.

Figure 2:
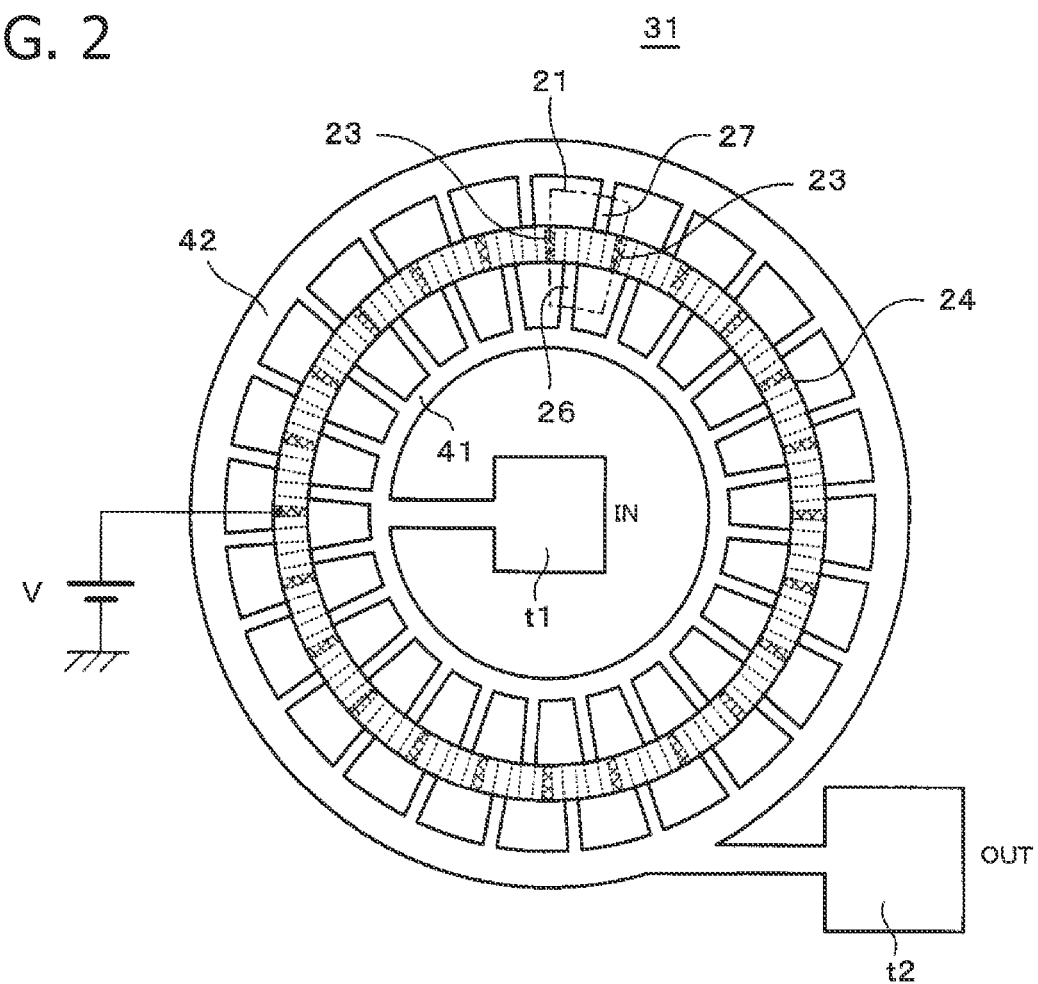
FIG. 2 is a schematic plan view showing a first embodiment of a resonator of the present invention.
Figure 3:
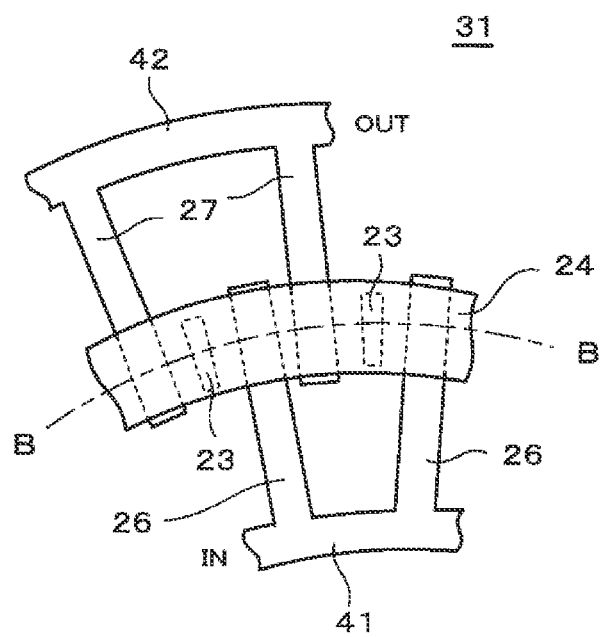
FIG. 3 is an enlarged view of a main portion of the resonator shown in FIG. 2.
Figure 4:
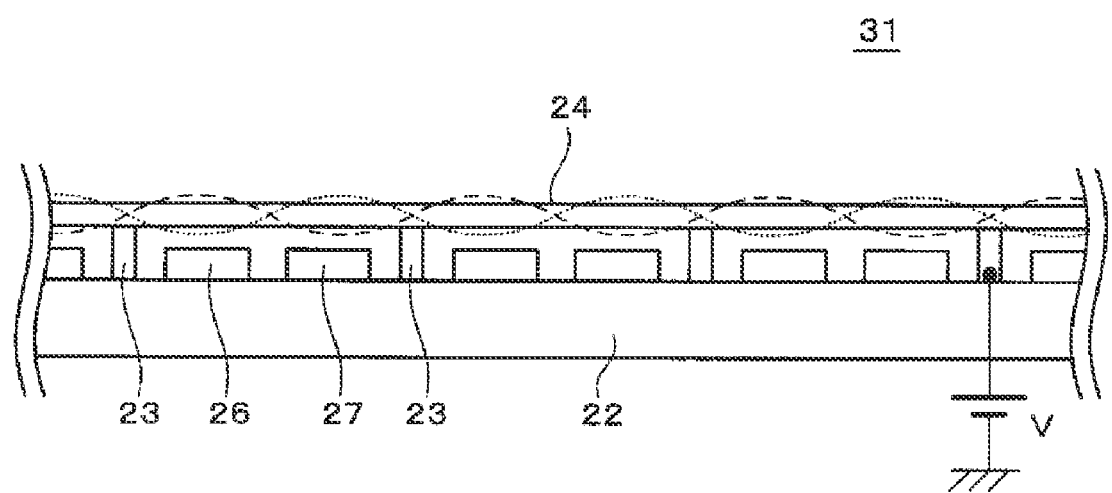
FIG. 4 is a sectional view of the resonator of the first embodiment taken along line B-B in FIG. 2.

A first embodiment of the resonator, or so-called parallel resonator, of an embodiment of the present invention is shown in FIG. 2 to FIG. 4. These drawings show a schematic configuration, in which FIG. 2 is a plan view of the entire portion of the resonator, FIG. 3 is a plan view of the unit resonator element in the resonator, and FIG. 4 is a sectional view (taken along line B-B in FIG. 3) of several unit resonator elements.

A resonator 31 of this embodiment is configured by a plurality of the above-described resonator elements 21 arranged on a substrate in a closed pattern, and the oscillating component 24 of the plurality of resonator elements 21 continuously formed in an integrated manner. The substrate 22 is composed of a substrate having insulating property on the surface on which the lower electrodes are formed. For example, a semiconductor substrate having an insulating film formed thereon, or an insulating glass substrate, and the like are used as the substrate. All resonator elements 21 arranged in the parallel configuration are arranged in an annular shape such that the elements are point symmetrically arranged with respect to the center of the closed system, and in this embodiment annularly arranged to form a circular shape. In this case, the continuously integrated oscillating component 24 having a closed geometry is formed according to a circular annular shape.

In other words, a plurality of resonator elements 21 are arranged in a line and in a circle, so as to alternatively arrange the antinodes and nodes of oscillation of the oscillating component 24.

The input electrodes 26 of the individual resonator elements 21 are connected to a wiring in a concentric circuit shape (forming so-called input signal line together with the input electrode 26) 41 formed inside or outside, which is "inside" in this embodiment, the circular oscillating component 24. The output electrodes 27 of the individual resonator element 21 are connected to a wiring in a concentric circuit shape (forming so-called output signal line together with the output electrodes 27) 42 formed outside or inside, which is "outside" in this embodiment, the circular oscillating component 24. An electrode pad, or so-called input terminal t1, is derived as being extended inwardly from the wiring 41 in a concentric circuit shape of the input side, and an electrode pad, or so-called output terminal t2, is derived as being extended outwardly from the concentric wiring 42 on the output side.

In addition, the closed-circular oscillating component 24 is formed so as to keep antinode-to-antinode distance and node-to-node distance of oscillation constant. Length of the closed-circular oscillating component 24 is as long as an integer multiple of wavelength of oscillation. In other words, the oscillating component 24 is formed as being circularly connected, so as to keep numbers of antinodes and nodes of oscillation even and the same.

The support components 23 of the continuously integrated oscillating component 24 are formed at the nodes of oscillation. In this embodiment, as shown in FIG. 4, support components 23 are provided on both sides while placing the input electrode 26 and the output electrode 27 of the unit resonator element in between, in other words, at every other node of oscillation. FIG. 4 is a schematic drawing, and the pedestals 28 connected to the support components 23 shown in FIG. 1 are omitted. The support components 23 are not limited to be provided at every other node, but may be provided at each node, or at every two or more nodes, as far as a strength of the oscillating component 24 may be obtained, that is, as far as the oscillating component 24 is not brought into contact with the lower electrodes 26, 27.

The resonator 31 of this embodiment is configured by, for example, twenty-four unit resonator elements 21 shown in FIG. 1 connected according to a circular annular pattern.

The resonator 31 of the first embodiment is configured by arranging the resonator elements 21 according to a circular annular pattern, so that the positional relation between the entire resonator 31 based on a parallel arrangement and each unit resonator element 21 is equalized for all resonator elements 21, and structural variation in the resonator elements 21 is less likely to occur. Also stress applied to the oscillating component 24 of each unit resonator element 21 may be all equalized. Therefore, variation in characteristics of the individual resonator elements may be suppressed, lowering of the Q-value caused by adoption of parallel configuration may be suppressed, and whereby the Q-value equivalent to that expected of the unit resonator may be obtained.

The oscillating component 24 of a plurality of resonator elements 21, arranged according to an annular pattern, is formed in a continuously integrated manner as shown in FIG. 2, so that the number of support components 23 relative to the number of antinodes of oscillation becomes less, whereby kinetic energy of oscillation leaked through the support components 23 to the substrate 22 side becomes small. In other words, a part of kinetic energy leaking towards the substrate side will contribute to oscillation of the adjacent resonator elements 21.

The plurality of resonator elements are arranged according to a circular annular pattern, as being point symmetrically with respect to the center of the circuit, so that, with the continuously integrated configuration of the oscillating component 24, the entire portion of the resonator 31 may oscillate at a mode of higher order, the kinetic energy transmits to the adjacent resonator elements 21, and thereby the kinetic energy leaked to the substrate 22 side as whole may be reduced. As a consequence, the Q-value of the parallel resonator may be improved.

Since the length of oscillating component 24 is adjusted to as long as integer multiple of the wavelength of oscillation, the resonator 31 may be oscillated at a higher order mode. Provision of the support components 23 of the oscillating component 24 at the nodes of oscillation allows oscillation at a high order mode.

Figure 5B:
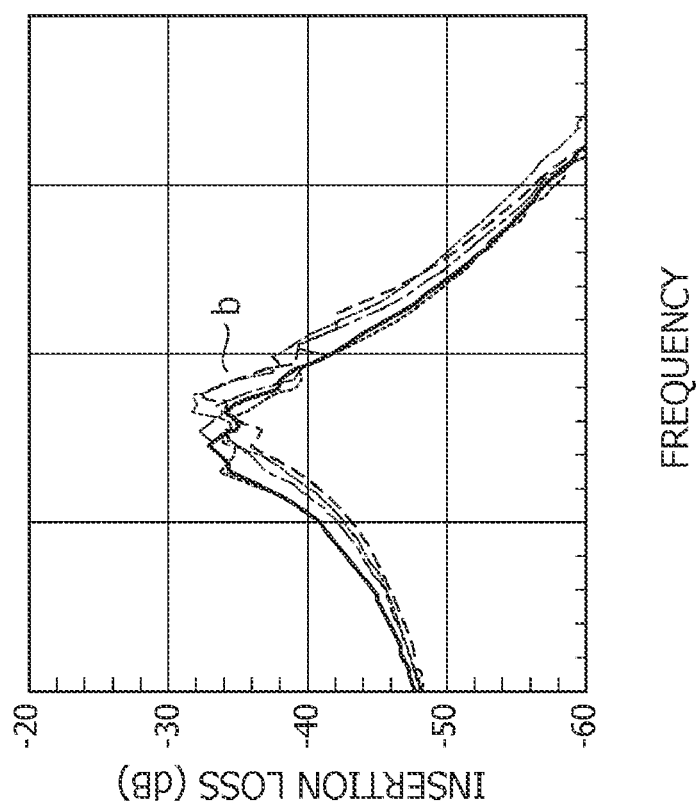
FIGS. 5A and 5B are drawings comparatively showing resonance characteristics of an annular parallel resonator according to this embodiment, and an arrayed parallel resonator, respectively.
Figure 5A:
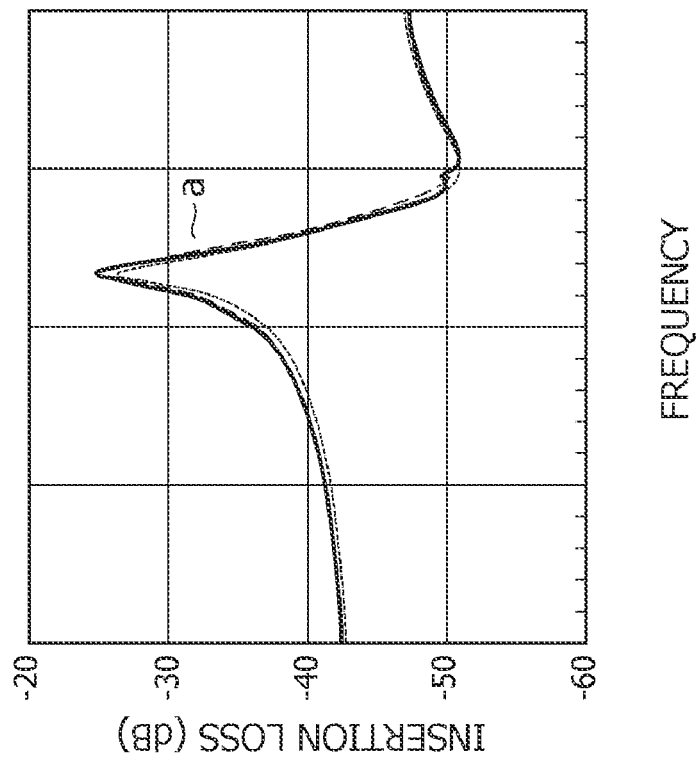

FIGS. 5A and 5B comparatively show resonance characteristics of an annular parallel resonator 31 of the first embodiment, and of an arrayed parallel resonator 1 of a comparative example shown in FIG. 26. FIG. 5A shows resonance characteristics "a" of the parallel resonator 31 of the first embodiment, and FIG. 5B shows resonance characteristics "b" of the parallel resonator 1 according to a comparative example. FIG. 5A shows characteristics obtained when using a sample in which the number of resonator elements arranged in parallel is 32. FIG. 5B shows characteristics obtained when using a sample in which the number of resonator elements arranged in parallel is 30. In case of a parallel configuration aimed at reducing the insertion loss observed in resonance peak, the arrayed parallel configuration is found to cause split of the peak, decrease the Q-value, and cause large variation in the Q-value (see FIG. 5B). The annular parallel configuration of this embodiment is found to almost completely eliminate the peak splitting, to reduce the Q-value, and to largely reduce variation in the Q-value (see FIG. 5A).

Figure 6:
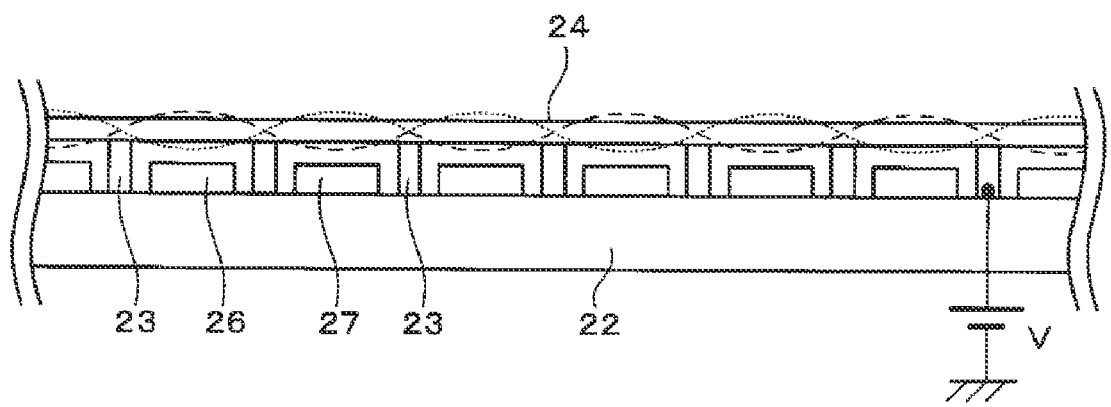
FIG. 6 is a schematic plan view showing a second embodiment of the resonator of the present invention.

FIG. 6 shows a second embodiment of the resonator, so-called parallel resonator, of the present invention. A resonator 55 of this embodiment is configured as having the support components 23 arranged at every node of oscillation. The configurations other than the support components 23, including the input electrode 26, the output electrode 27, and the oscillating component 24 of the unit resonator element 21, are same as those of the first embodiment shown in FIG. 2, FIG. 4, so that any portions corresponded to those shown in FIG. 4 are given with the same reference numerals, so as to avoid repetitive explanation.

According to the resonator 55 of the second embodiment, since the support components 23 are arranged at all nodes of oscillation, the resonation mode is limited, and whereby accuracy of the Q-value improves. Other effects obtainable herein are same as those in the above-described first embodiment.

Figure 7A:
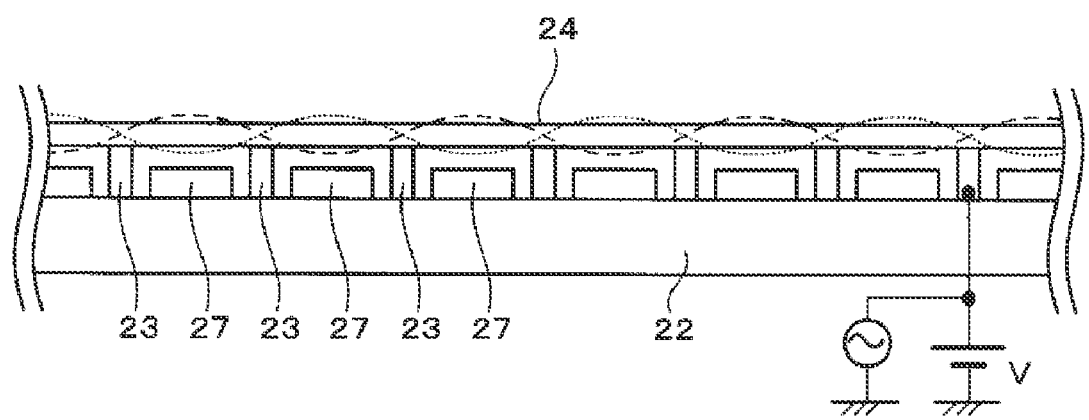
FIGS. 7A and 7B is a schematic plan view showing a third embodiment of the resonator of the present invention, and a sectional view of the unit resonator element thereof, respectively.
Figure 7B:
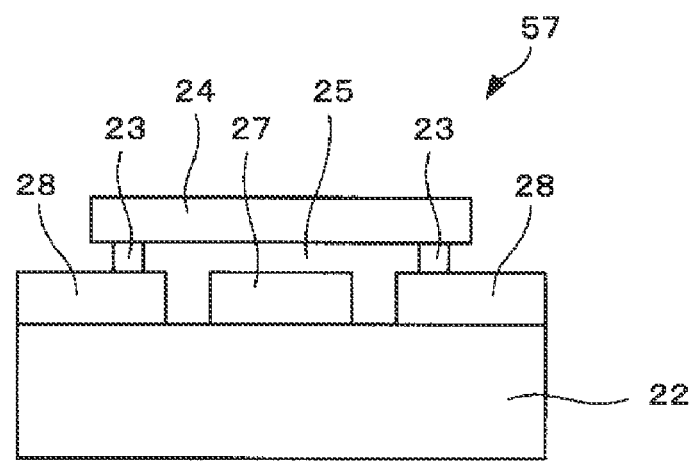

FIGS. 7A and 7B show a third embodiment of the resonator, so-called parallel resonator, of the present invention. The resonator 56 of this embodiment is configured by forming only the output electrode 27 formed as the lower electrode, and by arranging the support components 23 so as to hold each output electrode 27 in between, or in other words, at every node of oscillation (corresponding to every other antinode of oscillation) of the oscillating component 24. In this embodiment, DC bias voltage V is applied through the support component 23 to the oscillating component 24, and also input signal is inputted. In this case, the support component 23 (or the oscillating component 24) functions also as the input electrode. In the third embodiment, a unit resonator element 57 is configured by the single output electrode 27 and the oscillating component 24 held by both support components 23, and a plurality of unit resonator elements 57 are arranged according to a circular annular pattern. Other configuration including oscillating component 24 and so forth are same as those in the first embodiment shown in FIG. 2, FIG. 4. Thus, any portion corresponded to those shown in FIG. 4 will be given with the same reference numerals, so as to avoid repetitive explanation.

Also by the resonator 56 according to the third embodiment, the effects same as those in the above-described first embodiment may be obtained.

Figures 8A, 8B:
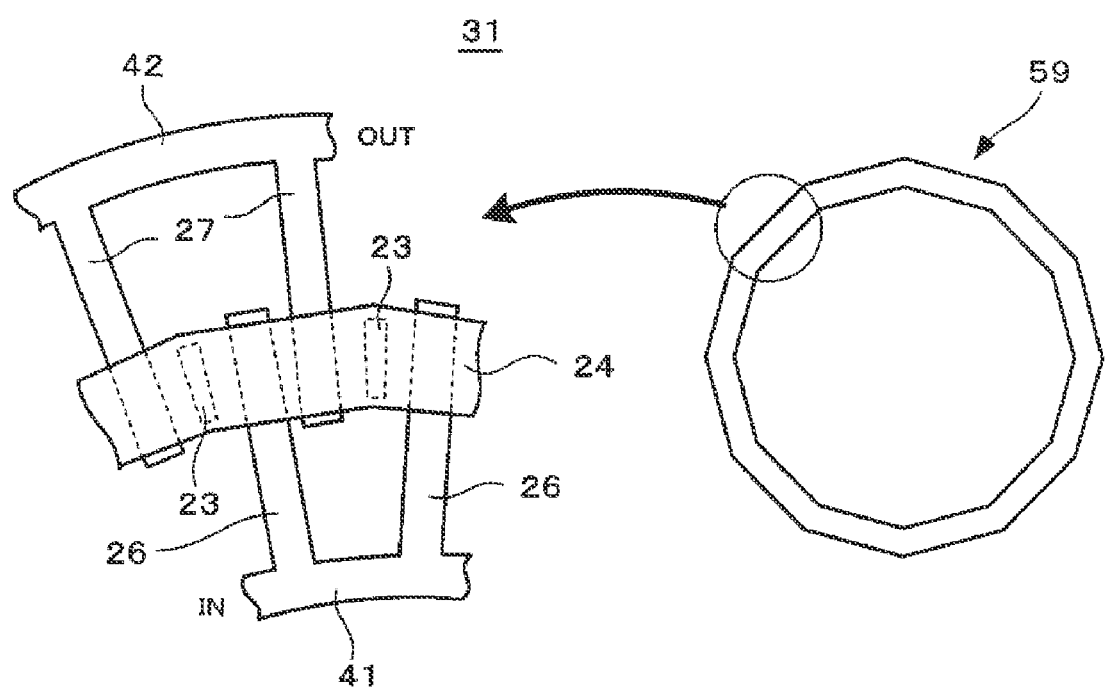
FIGS. 8A and 8B are a schematic plan view of a main portion of a fourth embodiment of the resonator of the present invention, and a schematic drawing showing a polygonal annular geometry of the unit resonator element thereof, respectively.

FIGS. 8A and 8B show a fourth embodiment of the resonator, so-called parallel resonator, of the present invention. The resonator 59 of this embodiment is configured by annularly connecting the unit resonator elements 21 so as to form a polygonal shape. The polygon may be even-numbered equilateral polygon such as equilateral hexagon, equilateral octagon and so forth. Configurations other than the polygonal configuration are same as those in the first embodiment shown in FIG. 2 to FIG. 4, so any portions corresponded to those in FIG. 2 to FIG. 4 will be given with the same reference numerals, so as to avoid repetitive explanation.

Also by the resonator 59 according to the fourth embodiment, the effects same as those in the above-described first embodiment may be obtained.

Figure 9A:
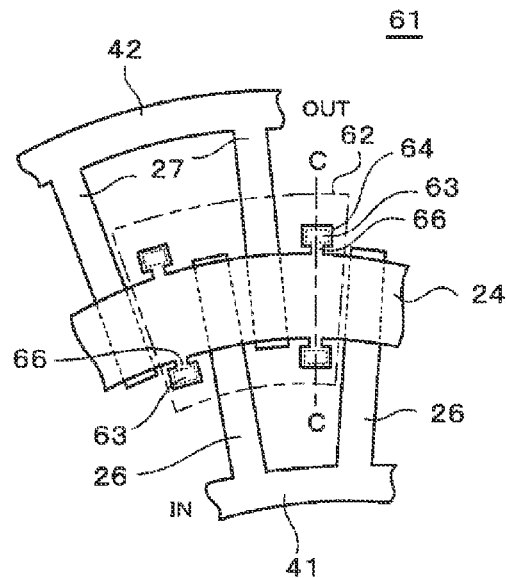
FIGS. 9A, 9B and 9C are a plan view, a sectional view taken along line C-C of FIG. 9A and a plan view of an oscillating component, respectively, showing another example of the unit resonator element adopted to the resonator of an embodiment of the resonator of the present invention.
Figure 9B:
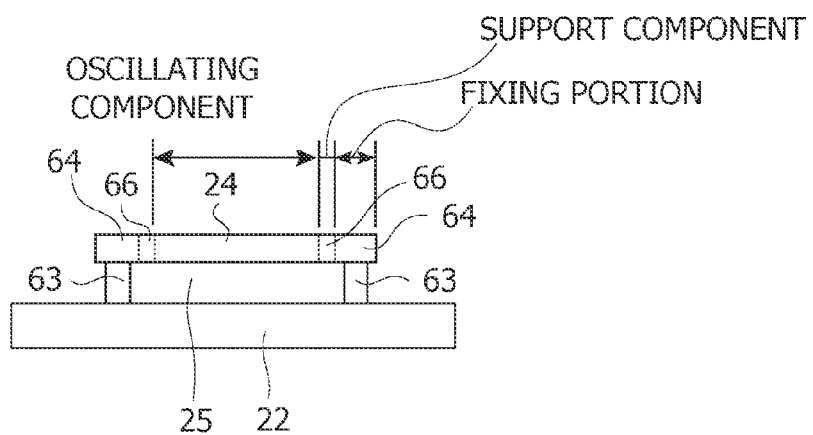
Figure 9C:
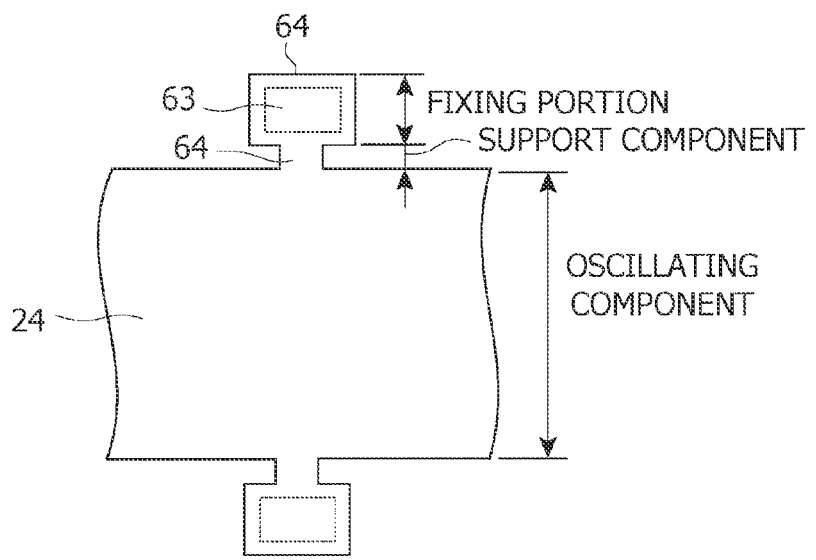

The resonator in the above-described embodiment is configured by arranging the support components 23 of the oscillating component 24 in the resonator element below the oscillating component 24. FIGS. 9A, 9B and 9C show another configuration of the resonator, differed in the way of supporting the oscillating component in the resonator element.

The resonator 61 of this embodiment has, as shown in FIGS. 9A, 9B and 9C, a resonator element 62 configured by an oscillating component 24, support components 66 fixing the oscillating component 24 through fixing portions 63, 64 to the substrate 22, and the input electrode 26 and the output electrode 27 handling electric signals, formed on the substrate 22 as being opposed with the oscillating component 24 while placing the micro space 25 in between, wherein the support components 66 are arranged outside the oscillating component 24. Reference numeral 41 represents a wiring on the input side, and reference numeral 42 represents a wiring on the output side. The support components 66 are formed outside the oscillating component 24, as being integrated therewith. Outside the support components 66, the fixing portions 64 are formed as being continuously overhung therefrom and integrated therewith, and the fixing portions 63 are arranged under the fixing portions 64. The fixing portions 63 are fixed to electroconductive pedestals 81 which are formed on the substrate 22 at the same time when the input electrode 26 and the output electrode 27 being lower electrodes are formed on the substrate 22.

The support components 66 and the fixing portions 64 herein are formed as being continuously integrated with each other, and serve as overhung portions overhanging outwardly from the oscillating component 24. Each fixing portion of the support component 66 is therefore composed of three components, which are the pedestal 81, and the fixing portions 63 and 64.

The support components 66 are formed at the nodes of oscillation generated when the oscillating component 24 resonates, that is, the portions hardly cause oscillation. Position, size and rigidity of the support components 66 and the fixing portions 64 are set so that both ends of the oscillating component 24 can oscillate nearly as the free ends of oscillation.

In the resonator 61 of this embodiment, leakage of oscillation energy from the oscillating component 24 to the substrate 22 is very small, as compared with the resonator having the support components 23 arranged below the oscillating component 24. The resonator 61 is advantageous also in that the oscillation energy is less likely to be transmitted to the support components 66, because the support components 66 are arranged at the nodes of oscillation, similarly to as in the above-described embodiments.

Next, other embodiments of the resonator of the present invention using the resonator element 62 shown in FIGS. 9A and 9B will be explained.

Figure 10A:
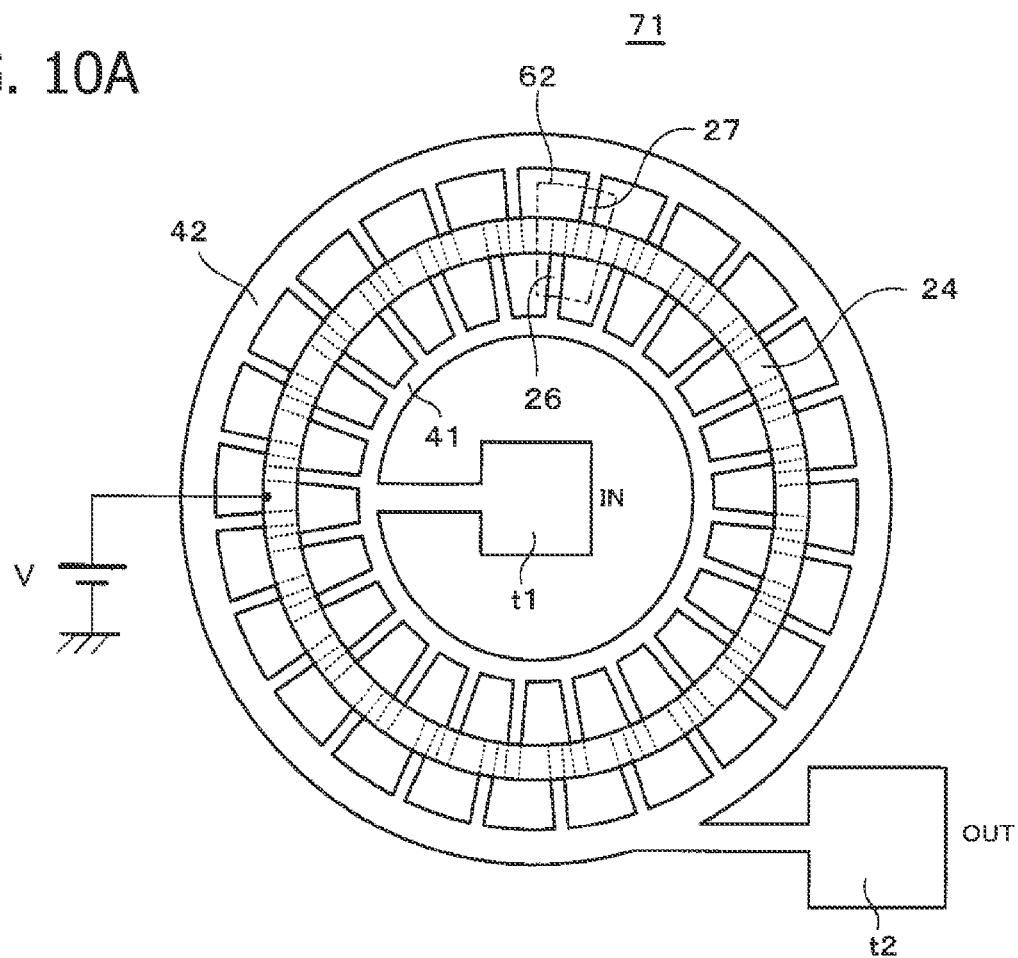
FIGS. 10A and 10B are a schematic plan view showing a fifth embodiment of the resonator of the present invention, and an enlarged view of the main portion thereof, respectively.
Figure 10B:
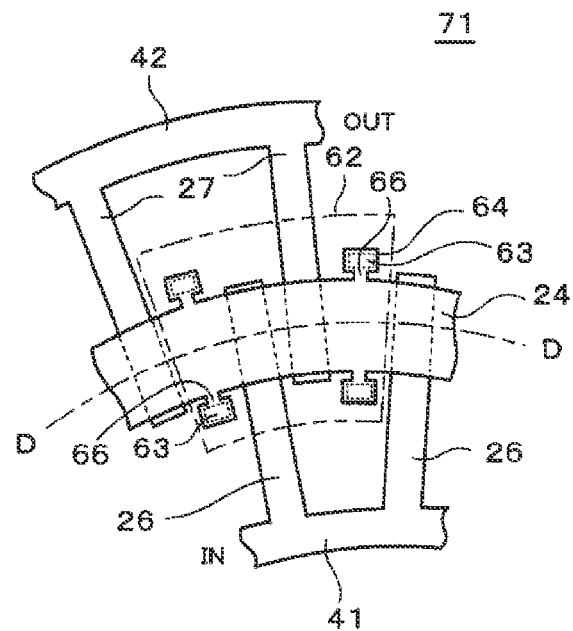
Figure 11:
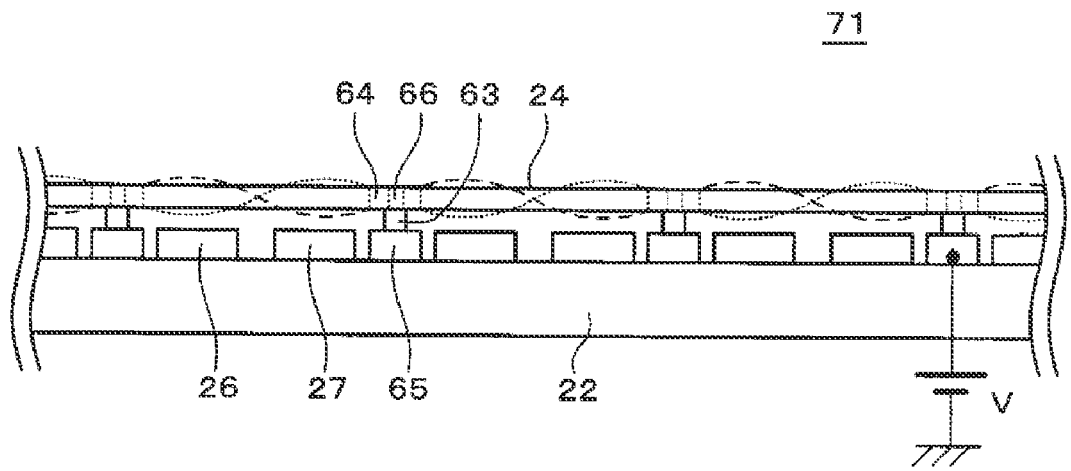
FIG. 11 is a sectional view (taken along line D-D in FIG. 10B) of a resonator of a fifth embodiment.

FIGS. 10A, 10B and FIG. 11 show a fifth embodiment of the resonator of the present invention, which is so-called parallel resonator. The drawings show a schematic configuration, in which FIG. 10A is a plan view showing the entire portion of the resonator, FIG. 10B is a plan view of a unit resonator element in the resonator, and FIG. 11 is a sectional view (taken along line D-D in FIG. 10A) of the resonator.

The resonator 71 of the fifth embodiment is configured by arranging a plurality of the above-described resonator elements 62 according to a closed pattern on the substrate 22, wherein the oscillating component 24 of the plurality of resonator elements 62 are continuously formed in an integrated manner. The substrate 22 is composed of a substrate having insulating property at least in the surficial portion thereof on which the lower electrodes are formed, similarly to as described in the above. For example, a semiconductor substrate having an insulating film formed thereon, or an insulating substrate may be used. All resonator elements 71 arranged in the parallel configuration are point symmetrically arranged with respect to the center of the closed system, and in this embodiment annularly arranged according to a circular formation. The closed continuously-integrated oscillating component 24 is formed according to a circular annular pattern.

In this embodiment, support components 66 of the oscillating component 24 are formed at every other node of oscillation, that is, at the portion corresponded to the node per a single wavelength in the secondary oscillation mode, on both outer sides of the inner circumferential side and outer circumferential side, of the oscillating component 24. In other words, the support components 66 are continuously formed from both sides of the oscillating component 24 in an integrated manner, as described previously. Four support components 66 in this embodiment are provided with respect to a unit resonator element. The support components 66 support the oscillating component 24, and are fixed through the fixing portions 64, 63 to electroconductive pedestals 65 which are formed at the same time when the input electrodes and output electrodes, being the lower electrodes, are formed on the substrate 22.

Figure 12:
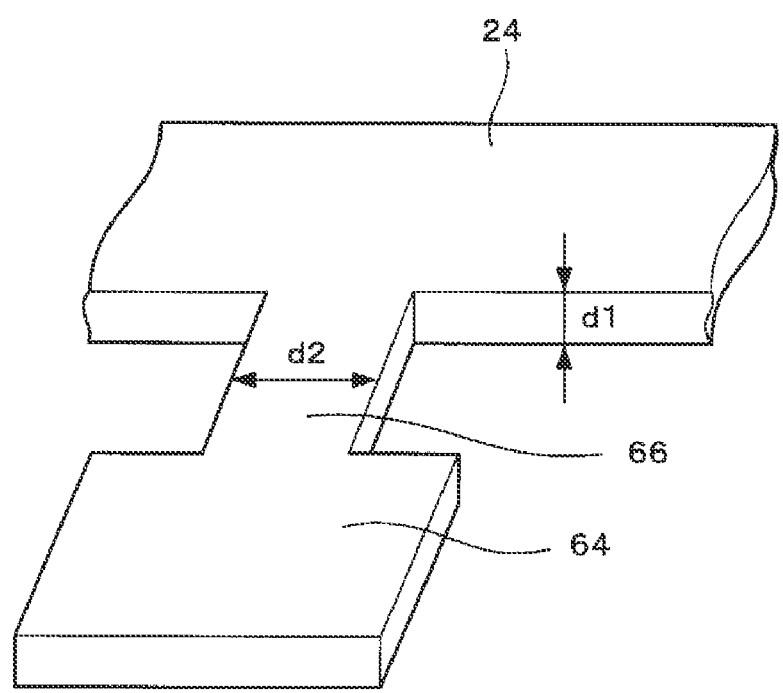
FIG. 12 is a perspective view showing an overhung portion for supporting, integrally continued from the oscillating component according to the present invention.

The support components 66 supporting the oscillating component 24 is the portions brought into contact with the oscillating component 24 as shown in FIG. 12. To the support components 66, the fixing portions 64 are formed as being continued therefrom. An overhung portion overhanging outwardly from the oscillating component 24 has a geometry such that a wide fixing portion 64 is continued to a narrow support component 66. The support components 66 are formed as being continued from and integrated with the oscillating component 24, wherein width d2 is preferably set equal to film thickness of the oscillating component 24 (that is, the film thickness of the overhung portion composed of the support component 66 and the fixing portion 64) d1 (d2=d1). In other words, the narrow portion 64A preferably has a square sectional form. The overhung portion composed of the support component 66 and fixing portion 64 herein is formed on the same plane with the oscillating component 24. If the support components 66 and the fixing portions 64 are formed on the same plane with the oscillating component 24, mechanical loss at connection points of the support components 66 and the oscillating component 24 may be minimized. As a consequence, the Q-value of the oscillating body may be kept large. It was confirmed that, by adjusting to d1=d2, torsional motion of the support components 66 under oscillation of the oscillating component 24 becomes smooth, and that the Q-value is stably raised. It was also confirmed that too large width d2 of the narrow portion 64A made the torsion less likely to occur, whereas too small width destabilized the motion of the narrow portion 64A, and consequently failed in obtaining stable Q-value. It was confirmed that maximum point of the Q-value was obtained when the sectional geometry of the narrow portion 64A is square.

Other configurations are similar to those as described in the above referring to FIG. 2 to FIG. 4, therefore the detailed explanation will omitted. Any portions corresponding to those appear in FIG. 2 to FIG. 4 will be given with the same reference numerals, and the explanations therefor will omitted.

The resonator 71 of the fifth embodiment may raise a uniform oscillation mode, because oscillation mode of high orders, based on the unit of wave number of resonation of the resonator elements 62 is raised, and the oscillating component 24 is formed as a closed annular system. In this closed system, the node-to-node distance and the antinode-to-antinode distance of oscillation of every resonator element 62 are equal. Therefore, whichever resonator elements 62 in the closed system are compared, the resonator characteristics are equal with each other, successfully avoiding structural variation in the resonator elements 62. As a consequence, variations in the characteristics of the individual resonator elements 62 may be suppressed, and whereby the resonator having large Q-value and small insertion loss may be obtained. Moreover, since the fixing portions 63 of the oscillating component 24 are arranged outside the oscillating component 24, leakage of oscillation energy towards the substrate 22 side, possibly routed as the oscillating component 24→overhung portion 64→fixing portions 63→substrate 22, may be reduced, so that still larger Q-value may be obtained.

Figure 13A:
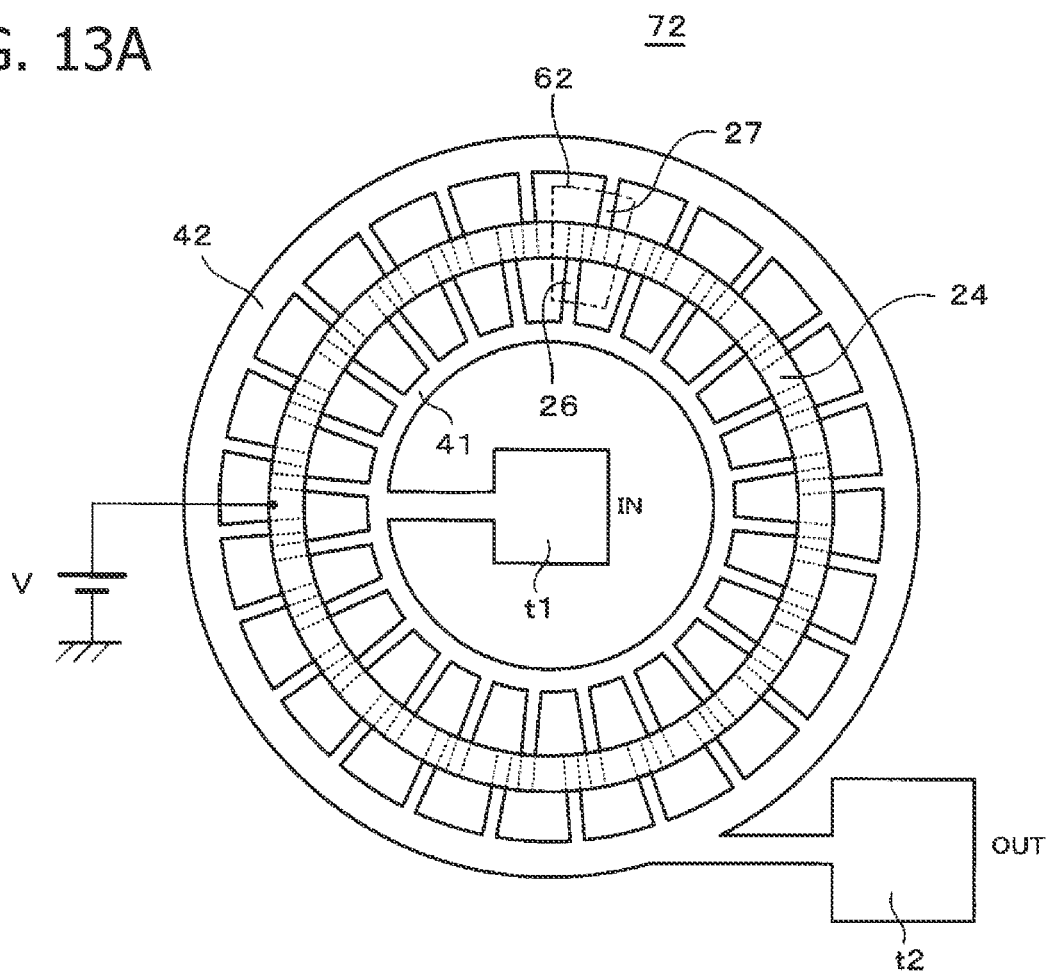
FIGS. 13A and 13B are a schematic plan view showing a sixth embodiment of the resonator of the present invention, an enlarged view of the main portion thereof, respectively.
Figure 13B:
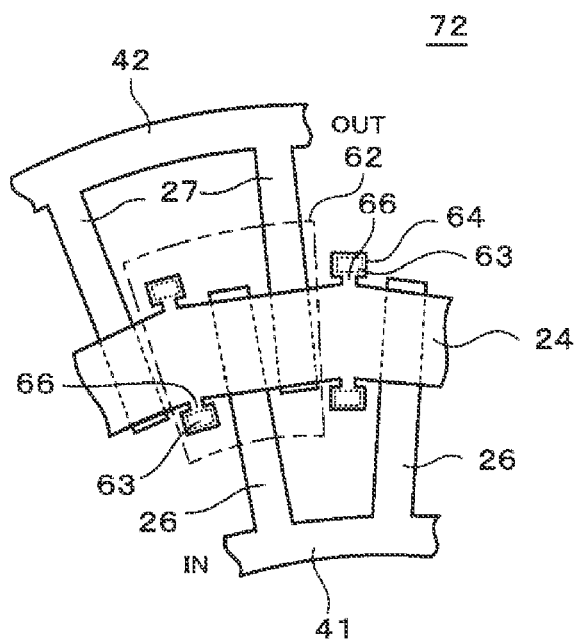

FIGS. 13A and 13B show a sixth embodiment of the resonator of the present invention, which is so-called parallel resonator.

A resonator 72 according to this embodiment is configured by connecting the unit resonator elements 62 in a polygonal annular manner. In this embodiment, the oscillating components 24 are formed to give a closed polygonal system. The polygon may be equilateral polygons of even numbers, such as equilateral hexagon, equilateral octagon, and so forth, similarly to as described previously. Configurations other than the polygonal configuration are same with those in the fifth embodiment shown in FIGS. 10A and 10B, so any portions corresponding to those shown in FIGS. 10A and 10B will be given with the same reference numerals so as to avoid repetitive explanation.

The resonator 72 according to the sixth embodiment, configured by connecting the resonator elements 62 so as to form a closed polygonal system, may raise effects similar to those explained in the fifth embodiment. For example, because resonator elements 62 have the same geometry each other, whereby variation in the characteristics of the individual resonator elements 62 may be suppressed, and high Q-value and small insertion loss are obtained. Since the fixing portions 63 are arranged on both outer sides of the oscillating component 24, leakage of oscillation energy towards the substrate 22 may be reduced, so that still larger Q-value may be obtained.

Although the resonator elements 62 of the fifth and sixth embodiments are configured under the equivalent conditions, the resonator of the closed system may be configured also by combining unequivalent resonator elements depending on a way the closed system is made.

Figure 14A:
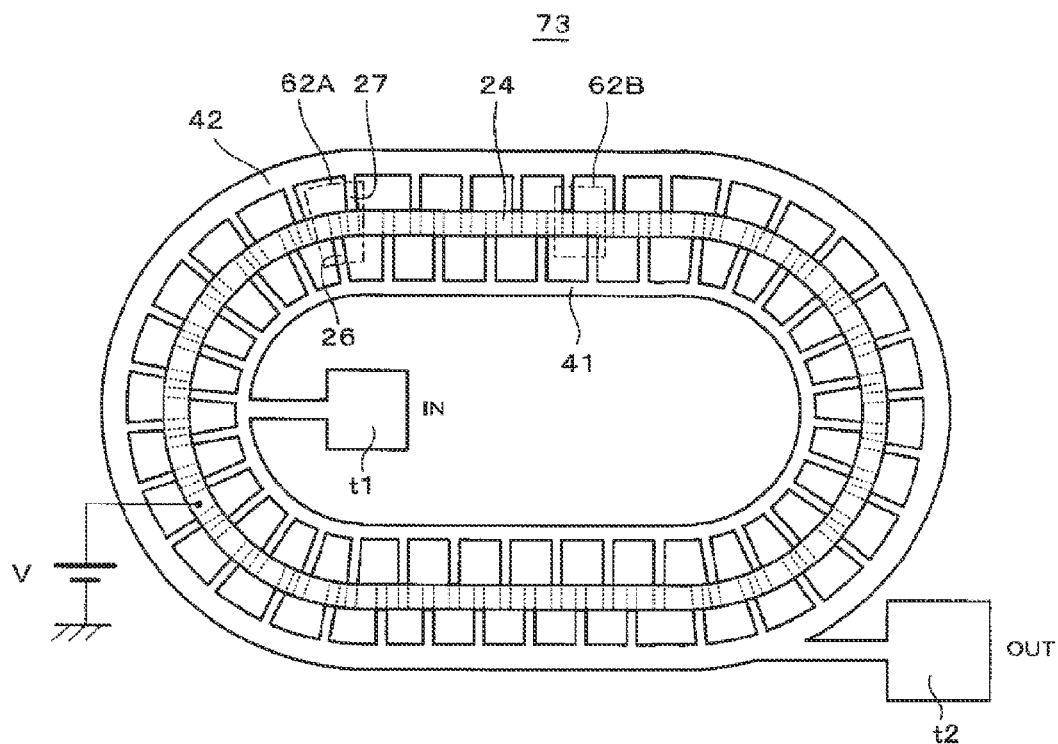
FIGS. 14A, 14B and 14C are schematic plan view showing a seventh embodiment of the resonator of the present invention, an enlarged view of a main portion thereof and a schematic plan view showing the alternate placement layer of the seventh embodiment applied onto a pixel array unit, respectively.
Figure 14B:
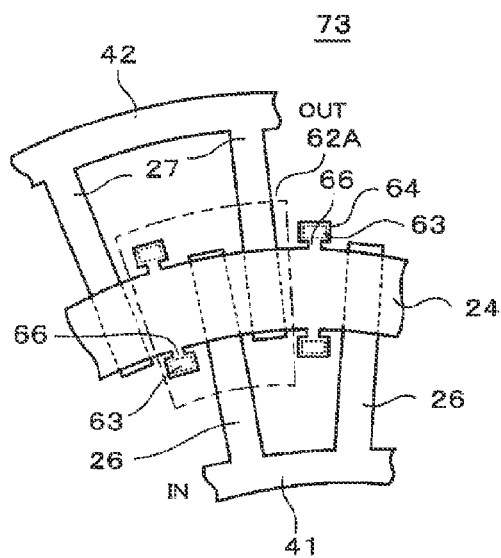
Figure 14C:
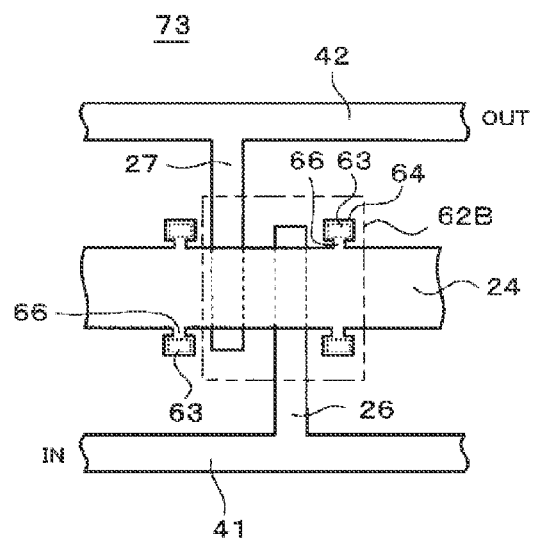

FIGS. 14A to 14C show a seventh embodiment of the resonator according to the present invention, so-called parallel resonator, based on a combination of unequivalent resonator elements. A resonator 73 according to this embodiment is configured by combining two types of resonator elements 62A, 62B shown in FIGS. 14B and 14, respectively, so as to form a closed system, according to a track-like annular pattern constituted by straight lines and curves (arcs, for example). The resonator elements 62A shown in FIG. 14B are arranged at the curved portion, more specifically formed in the curves shape together with the oscillating component 24, the wiring 42 connected to the output electrodes and the wiring 41 connected to the input electrodes, similarly to shape as shown in FIG. 10B. The resonator elements 62B shown in FIG. 14C are arranged at the straight line portions, and the oscillating component 24, and the wiring 42 connected to the output electrodes and the wiring 41 connected to the input electrodes are formed in a straight line shape.

Other aspect of the configuration, such as arranging the support components 66 which are continued from both sides of the oscillating component, are same as those described in the fifth embodiment, so any portions corresponding to those in FIGS. 10A and 10B will be given with the same reference numerals so as to avoid repetitive explanation.

In the resonator 73 according to the seventh embodiment, two types of resonator elements 62A, 62B are designed to have the same resonance frequency, although differed in the oscillation mode. By virtue of this configuration, the resonator configured herein can raise an oscillation mode of higher orders based on the unit of wave number of resonation of the resonator element, similarly to as in the fifth and sixth embodiments. The oscillating component 24 formed to give a closed system similarly to as described in the above is likely to raise an uniform oscillation mode, wherein whichever resonator element in the closed system can oscillate at the same resonance frequency.

Although design factors controlling the characteristics of two types of resonator elements 62A, 62B are increased, this embodiment is largely advantageous in that the oscillating component 24 can adopt the straight-line resonator elements 62B as the resonator elements. Since the structures inside and outside of the closed system becomes equal, in the straight-line oscillating component 24, calculation of the stress-distortion and manufacturing may be made easier than those for the curved (arc-like) oscillating component 24. As a consequence, desired frequency characteristics may more readily be obtained.

For this reason, the resonator 73 of the seventh embodiment is preferably configured at least so as to contain a larger ratio of the straight portions than the curved portions, and so as to contain longest possible straight portions.

Also in this embodiment, large Q-value and small insertion loss may be obtained similarly to as described previously. Also leakage of oscillation energy towards the substrate 22 may be reduced, so that still larger Q-value may be obtained.

Figure 15:
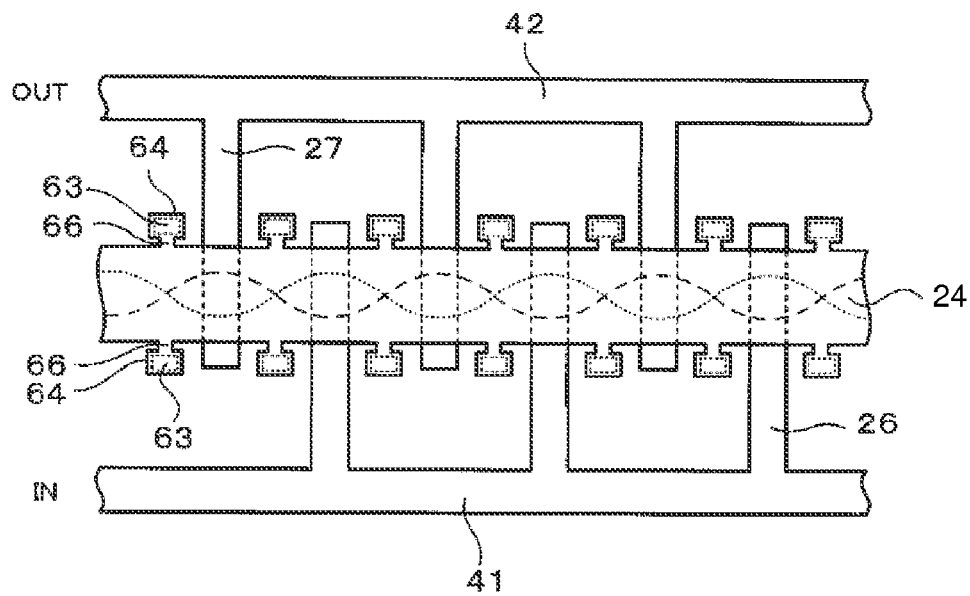
FIG. 15 is a drawing showing an exemplary configuration of a method of supporting the oscillating component, to be adopted to the resonator according to the present invention.
Figure 16:
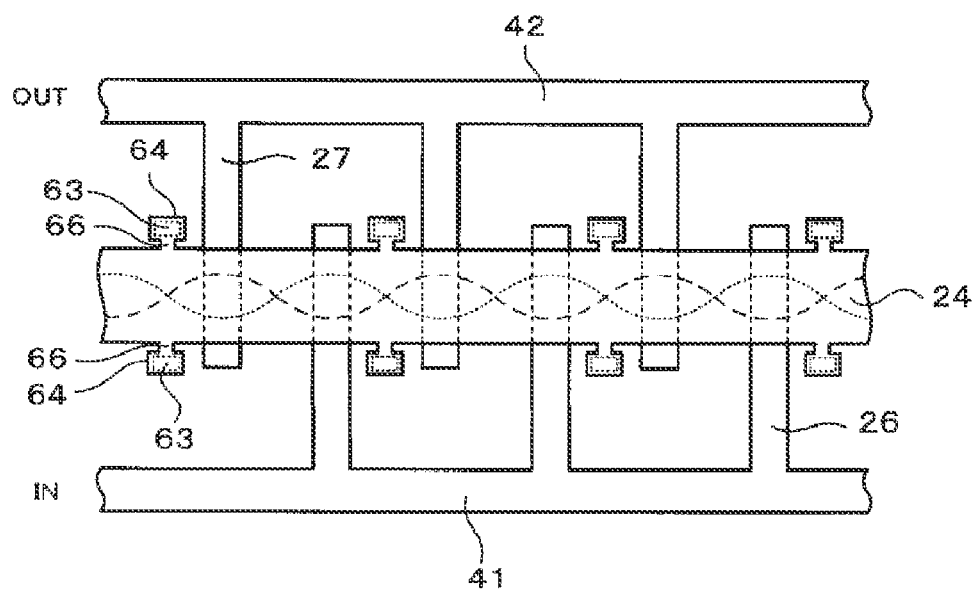
FIG. 16 is a drawing showing another exemplary configuration of the method of supporting the oscillating component, to be adopted to the resonator according to the present invention.
Figure 17:
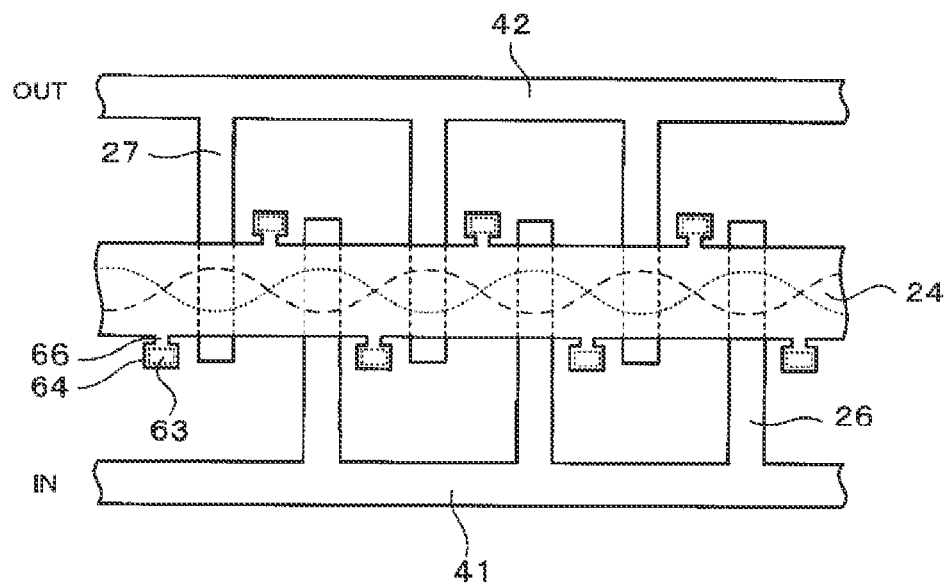
FIG. 17 is a drawing showing still another exemplary configuration of the method of supporting the oscillating component, to be adopted to the resonator according to the present invention.

FIG. 15 to FIG. 17 show an exemplary method of supporting the oscillating component to be adopted to the resonator according to the above-described fifth to seventh embodiments, and more specifically exemplary arrangement positions of the support components. Any portions corresponding to those in the fifth to seventh embodiment will be given with the same reference numerals.

In the method of supporting shown in FIG. 15, the fixing portions 63 are arranged on both outer sides of the oscillating component 24 as being corresponded to all nodes of oscillation. In other words, the resonator is configured by forming the overhung portions 64 as being continued from the oscillating component 24 and being integrated therewith, on both sides thereof at the positions corresponded to all nodes of oscillation, and by arranging the fixing portions 63 below the overhung portions 64, so as to support all nodes of oscillating component 24 from both sides thereof. The oscillating component 24 oscillates under a primary drive mode wherein the supports are provided for every single wavelength. In other words, the oscillating component 24 oscillates under secondary drive mode wherein the supports are provided for every half wavelength. In short, this resonator is configured so that, in the unit resonator element thereof, the oscillating component 24 is supported by 6 support components.

The exemplary case shown in FIG. 15, having the support components 66 connected to both sides of the oscillating component 24 at the positions corresponded to all nodes, may raise the Q-value of the resonator, may limit the resonance mode, and may increase accuracy of the Q-value.

The method of supporting shown in FIG. 16 is such that the support components 66 are arranged on both outer sides of the oscillating component 24 at positions corresponded to every node per a single wavelength of oscillation. In other words, the resonator is configured by forming the support components 66 on both sides of the oscillating component 24 as being integrated therewith and as being continued therefrom, at the positions corresponded to every node of a single wavelength of oscillation, and by arranging the fixing portions 63 below the fixing portions 64 as being continued from the support components 66. In short, this resonator is configured so that, in the unit resonator element thereof, the oscillating component 24 is supported by four support components 66. This configuration allows oscillation of the oscillating component 24 under the secondary drive mode, and may be applicable to the resonator making use of secondary-mode resonance frequency.

The exemplary case shown in FIG. 16, having the support components 66 connected from both sides of the oscillating component 24 at the positions corresponded to every other node of oscillation may give the resonator having large Q-value.

Although not shown in the drawings, in the resonator making use of tertiary-mode resonance frequency, two nodes of oscillation may appear between the support components 66 of both ends, in the unit resonating element.

The method of supporting the resonator shown in FIG. 17 is such as making use of secondary-mode resonance frequency. In this method of supporting, the support components 66 are arranged alternately on the inner circumferential side and on the outer circumferential side of the oscillating component 24, in other words, a single support component 66 is arranged for a node of oscillation. That is, the resonator is configured by forming the support components 66 one by one alternately on the inner circumferential side and on the outer circumferential side of the oscillating component 24, as being corresponded to the nodes of oscillation, and by arranging the fixing portions 63 below the fixing portions 64 as being continued from the support components 66. This resonator is configured so that, in the unit resonator element thereof, the oscillating component 24 is supported by 3 fixing portions 63.

As the example in FIG. 17, when it is configured that the support components 66 are connected alternately on the inner circumferential side and on the outer circumferential side of the oscillating component 24 with respect to the nodes of oscillation, the high Q-value may be obtained, and also more stable Q-value may be obtained easily because stability of state of resonance may be improved as compared with the resonator having the nodes which have no support components.

In the resonator supporting the above-described, closed-system oscillating component 24 from the outside thereof, when viewed on the basis of unit resonator, variation in the Q-value may be smaller in so-called, six-point-support configuration shown in FIG. 15 in which the oscillating component 24 is supported by the fixing portions 63 at all nodes, than in so-called, four-point-support configuration shown in FIG. 16 in which the oscillating component 24 is supported by the support components 66 at every other node. FIG. 22 is a graph showing variation in the Q-value in the four-point-support configuration. FIG. 23 is a graph showing variation in the Q-value in the six-point-support configuration. The abscissa axis of the graph represents the Q-value, and the ordinate axis represents the frequency.

From the graphs shown in FIG. 22 and FIG. 23, the four-point-support configuration was found to give a standard deviation σ of a normal distribution curve I, which serves as an index of variation in the Q-value, of σ=±10.6%, whereas, the six-point-support configuration was found to give a standard deviation σ of a normal distribution curve II of σ=±3.5%. It is therefore confirmed that the six-point-support configuration may more effectively reduce the variation in the Q-value, as compared with the four-point-support configuration. The Q-value is an essential parameter determining quality of the products, wherein small variation in the Q-value means small variation in the products.

Figure 18:
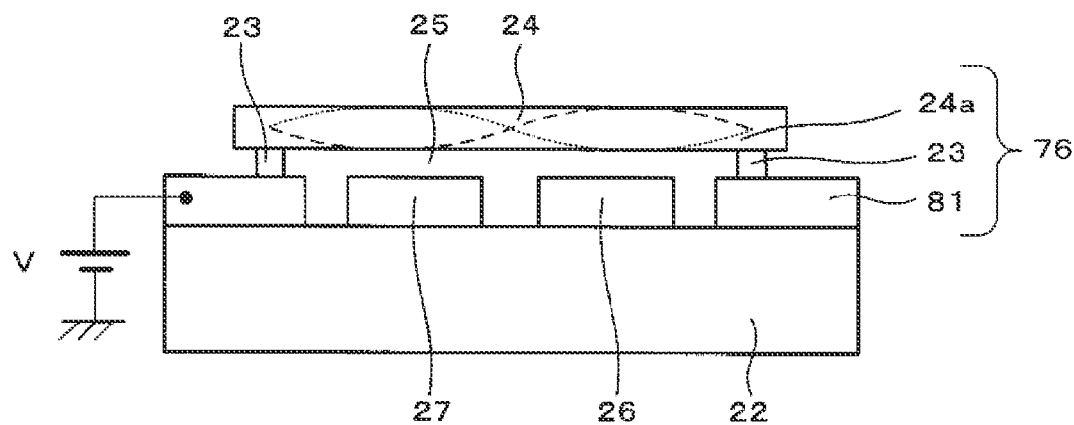
FIG. 18 is a drawing showing an exemplary configuration of a support mechanism of the oscillating component according to the present invention.
Figure 19:
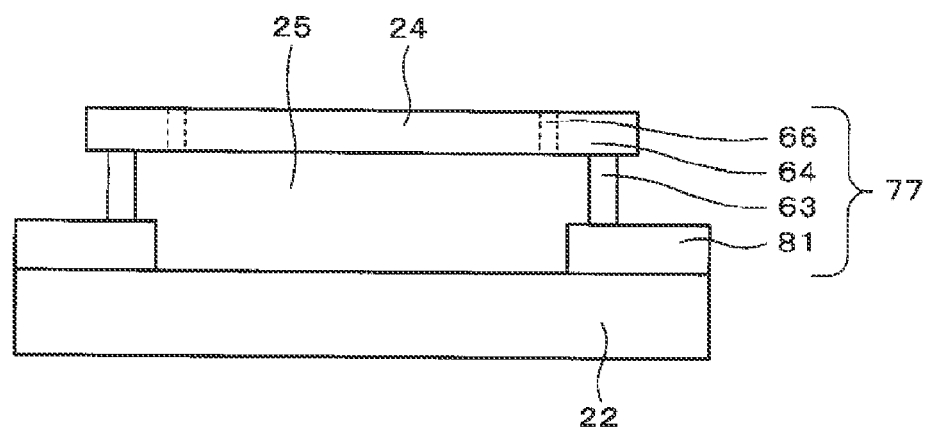
FIG. 19 is a drawing showing another exemplary configuration of the support mechanism of the oscillating component according to the present invention.
Figure 20:
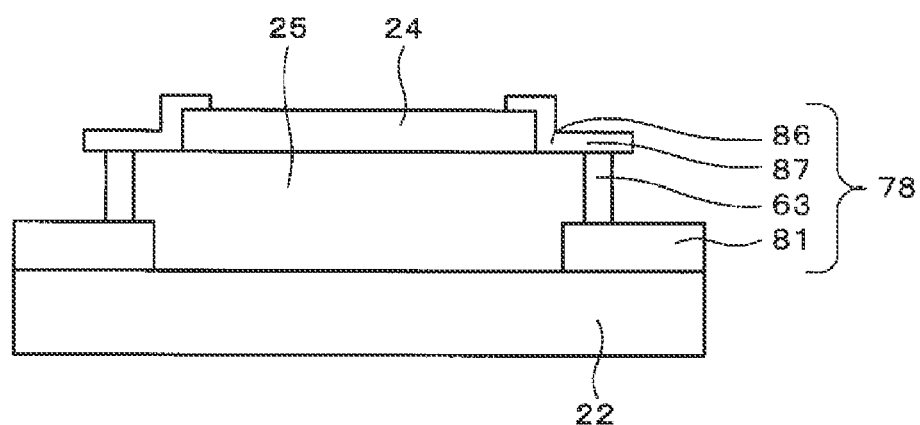
FIG. 20 is a drawing showing still another exemplary configuration of the support mechanism of the oscillating component according to the present invention.

FIG. 18 to FIG. 20 show exemplary support mechanisms for the oscillating component 24.

A support mechanism shown in FIG. 18 represents a case where the support components 23 are arranged below the oscillating component 24. A support mechanism 76 of this embodiment is composed of the electroconductive pedestals 81 formed on the substrate 22 at the same time when the input electrodes 26 and the output electrodes 27 which are the lower electrodes are formed on the substrate 22, support regions 24a corresponded to the nodes of oscillation of the oscillating component 24, and the support components 23 fixed on the pedestals 81, and support the support regions 24a on the oscillating component 24 side. Reference numeral 25 represents a space formed between the lower electrodes and the oscillating component 24. The pedestals 81 are formed using the same material and to the same film thickness with the lower electrodes. In the process of manufacturing, accurate processing may be performed by forming the pedestals 81, the input electrodes 26 and the output electrodes 27 as the lower electrodes, and the wirings 41, 42 connected thereto (see FIGS. 10A and 10B, FIGS. 13A and 13B, and FIGS. 14A to 14C) in the same process step, and by forming the oscillating component 24 and the support component 23 in the same process step.

A support mechanism shown in FIG. 19 represents a case where the support components 66 are arranged outside the oscillating component 24. The support mechanism 77 of this embodiment is configured by the electroconductive pedestals 81 formed on the substrate 22 at the same time when the input electrodes 26 and the output electrodes 27 which are the lower electrodes are formed on the substrate 22, the support components 66 formed outside the oscillating component 24 as being continued therefrom and integrated therewith, the fixing portions 64 continued from the support components 66, and the fixing portions 63 fixed to the pedestals 81 and support the fixing portions 64. Reference numeral 25 represents the space. The pedestals 81 are formed using the same material and the same film thickness with the lower electrodes. The support components 66 are formed as extended portions of the oscillating component 24 as being integrated therewith, and are formed at positions corresponded to the nodes of oscillation of the oscillating component 24. Each support component 66 is formed as having a narrow portion on the side brought into contact with the oscillating component 24, and a wide portion, similarly to as described in the above. In the process of manufacturing, accurate processing may be ensured by forming the pedestals 81, at the process steps same with those of the input electrodes 26 and the output electrodes 27 as the lower electrodes, and the wirings connected to these electrodes (corresponded, for example, to the wiring layers 41, 42 in FIG. 2), and by forming the support components 66, the fixing portions 64 and the fixing portions 63 in the same process step.

A first difference of the support mechanism 77 from the support mechanism 76 resides in arrangement of the support components. In the support mechanism 77, the fixing portions 63 are formed outside the closed system (circular, polygonal, track-like) of the oscillating component 24. A second difference resides in motion of the support components. The support components 23 of the support mechanism 76 show bending motion. The fixing portions 63 of the support mechanism 77 show twisting motion.

The support mechanism shown in FIG. 20 represents a case where the ratio of rigidity of the oscillating component 24 and the support components 86 is varied. The support mechanism 78 of this embodiment is configured by the support components 86 made of a material different from that of the oscillating component 24, fixing portions 87 integrated therewith and continued therefrom, the fixing portions 63 under the fixing portions 87, and the pedestals 81. In this case, the support components 86 are integrated with the oscillating component 24 as being partially overlap with the oscillating component 24. In particular, by making the material composing the support component 86 of the overhung portions different from the oscillating component 24, strength of supporting may largely be controlled.

Figure 21A:
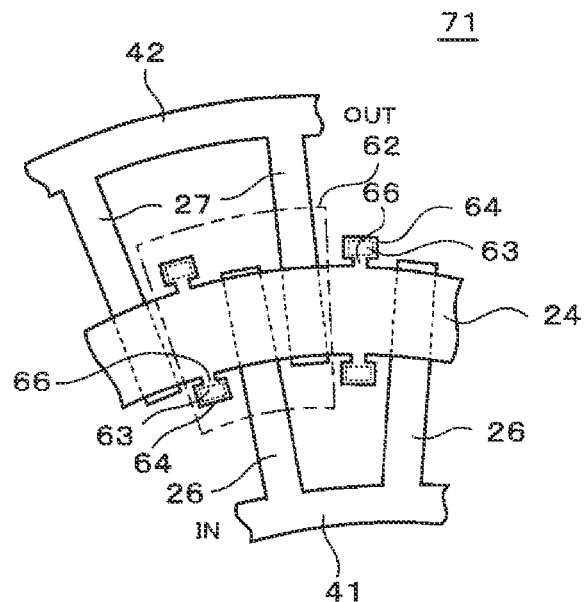
FIGS. 21A and 21B are a plan view and a perspective view of a main portion, respectively, for explaining the oscillating component formed with having a curvature.
Figure 21B:
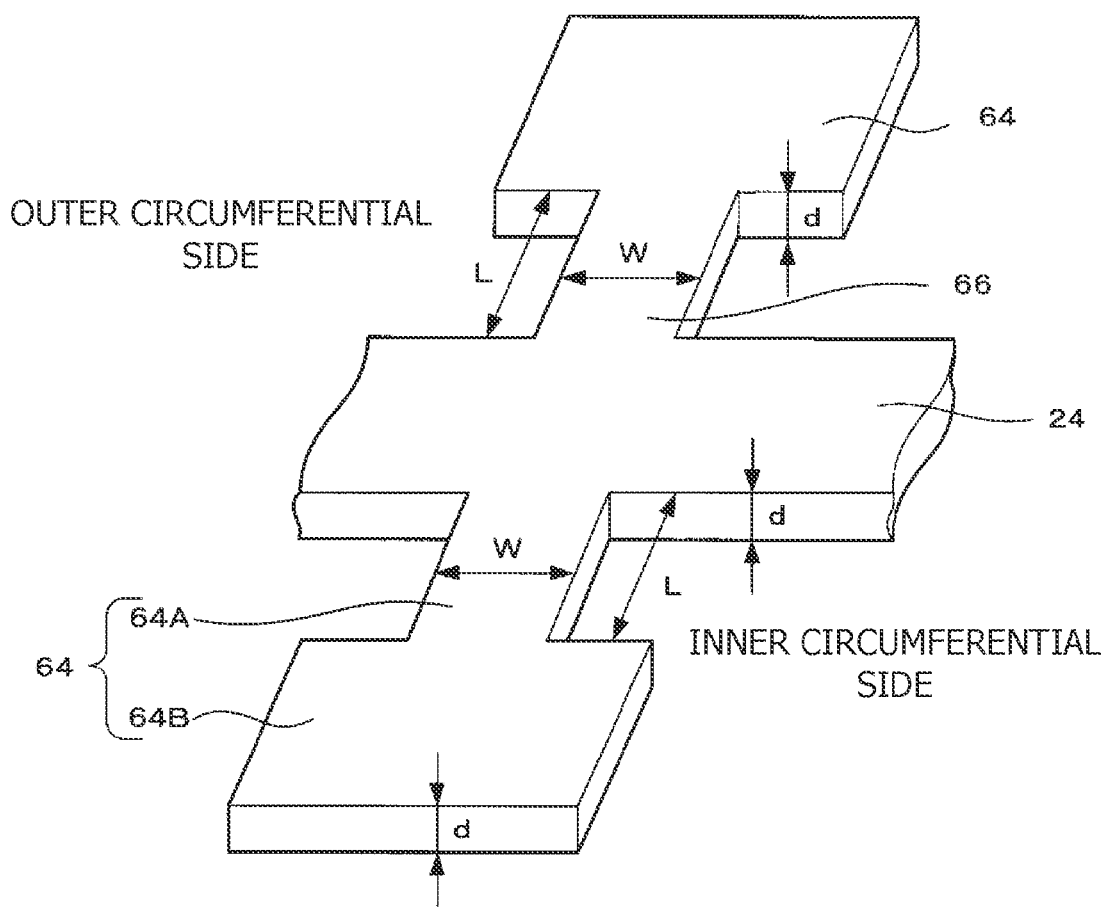

As shown in FIG. 21, the circular annular resonator described in the above causes difference in the inner and outer geometries of the resonator element 22. Due to difference in the curvature between the inner circumference and the outer circumference, width of a region assumable as the node of oscillation may vary. More specifically, the width of a region assumed as the node is narrower on the inner circumferential side of the closed system, than on the outer circumferential side. In this sort of configuration, it is preferable to provide difference in the structure of the support components 66 between the inner and outer sides, as shown in FIG. 21B and Table 1.

TABLE 1

|  | Length L | Width W | Thickness d | Hardness |
|---|---|---|---|---|
| Outer circumferential side | Shorter | Wider | Thicker | Harder |
| Inner circumferential side | Longer | Narrower | Thinner | Softer |

A part of, or all of length L, width w, thickness d, and hardness of the individual narrow portions 64A shown in Table 1 may be differed between the inner and outer sides of the closed oscillating component 24 as shown in Table 1. By making difference in the physical quantity of the overhung portion 64A between the inner and outer sides of the oscillating component 24, spring effect exerted to the oscillating body of the support components on the inner and outer circumferential sides becomes equivalent, and thereby the resonance of the oscillating body may advantageously be made uniform between the inner and outer circumferential sides of the annular circle. By virtue of this effect, the Q-value may be kept high.

Figure 24A:
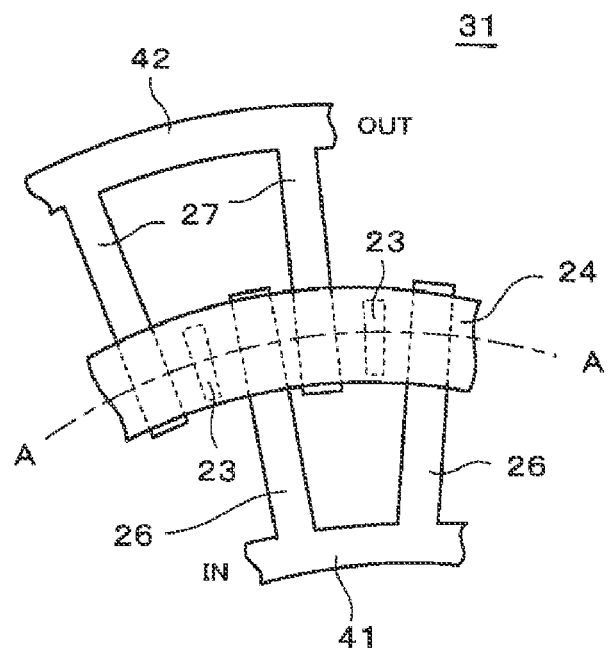
FIGS. 24A and 24B are a schematic plan view and a sectional view taken along line A-A therein, respectively, of a main portion according to an embodiment of the present invention.
Figure 24B:
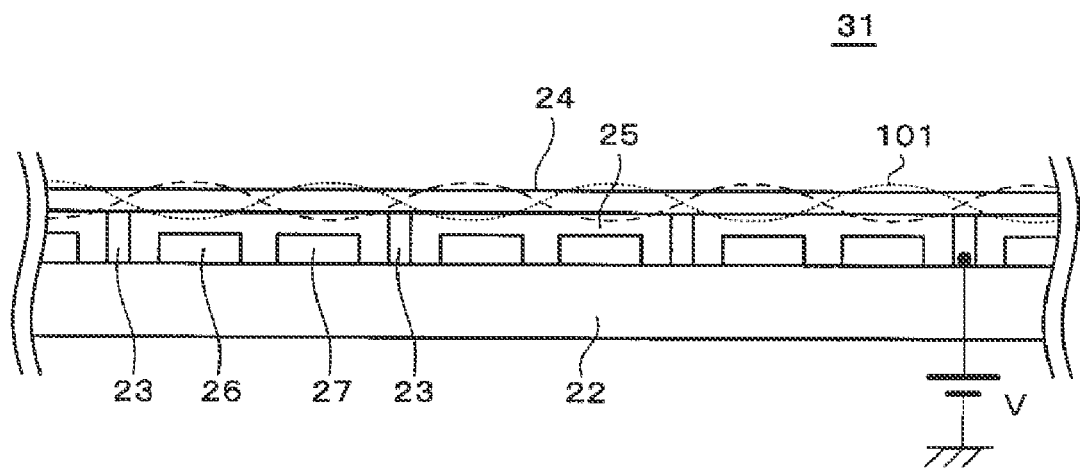

In the resonators 31, 55, 56, 59, 71 to 73 of the first to seventh embodiments described in the above, the input electrodes 26 and the output electrodes 27 on the substrate 22 are preferably formed, as shown in FIGS. 24A and 24B, at the position corresponded to the antinodes of oscillation 101 of the oscillating component 24, while keeping the space 25 in between. By placing the input electrodes 26 and the output electrodes 27 at the antinodes of oscillation 101, conversion efficiency of signals from the electrodes may be improved, amplitude of oscillation may increase, and thereby high Q-value may be obtained.

Although the above-described first to seventh embodiments showed the configuration having the input electrodes 26 and the output electrodes 27 provided below the oscillating component 24, another allowable configuration may be such as having the input electrodes 26 and the output electrodes 27 provided above, or sides (on the lateral of) the oscillating component 24. These embodiments will be explained in the next.

FIGS. 25A to 25C show an eighth embodiment of the resonator according to the present invention, so-called parallel resonator. A resonator 74 according to this embodiment is configured by forming the input electrodes 26 and the output electrodes 27 above the oscillating component 24. The input electrode 26 and the output electrodes 27 are formed, as shown in FIG. 25C, as being supported by electroconductive columns 75. The columns 75 are formed such that they are brought into contact with the inner-circumferential and outer-circumferential annular wirings 41 and 42 formed on the substrate 22. Other aspects of the configuration are similar to those in the first embodiment, so any constituents correspondent to those in FIG. 3 and FIG. 4 will be given with the same reference numerals, so as to avoid repetitive explanation. Also in this resonator 74, the oscillating component 24 oscillates at its specific resonance frequency by signals inputted from the input electrodes 26 provided above the oscillating component 24, and the signals are transmitted through the space 25 to the output electrodes 27.

According to the resonator 74 of the eighth embodiment, an effect of improving the Q-value may be obtained similarly to as described in the above. Similar effects may be obtained also by providing the electrodes 26 and 27 above the oscillating component 24, in the resonator structure shown in the first to seventh embodiments.

Although the electrodes 26 and 27 at the upper portion of the oscillating component 24, shown in FIG. 25A, are provided as being extended from the inner circumferential side and the outer circumferential side while placing the oscillating component 24 in between, the electrodes 26 and 27 may alternatively be provided as being extended from only either one of the inner circumferential side and the outer circumferential side.

FIGS. 26A to 26C show a ninth embodiment of the resonator according to the present invention, so-called parallel resonator. A resonator 75 of this embodiment is configured by providing the input electrodes 26 and the output electrodes 27 on the lateral surface of the oscillating component 24. In this embodiment, the input electrodes 26 are formed as being opposed while placing the oscillating component 24 in between, and as being opposed to both side faces of the inner circumferential side and the outer circumferential side of the oscillating component 24. Similarly, the output electrodes 27 are provided in adjacent to the input electrodes 26, as being opposed while placing the oscillating component 24 in between, and as being opposed to both side faces of the inner circumferential side and the outer circumferential side of the oscillating component 24. The input electrodes 26 and output electrodes 27 are provided as being shifted upward from the oscillating component 24 as shown in the figure, because the oscillating component 24 cannot be oscillated if they are provided at right beside the oscillating component 24. Alternatively, as indicated by the chain line, the input electrodes 26 and the output electrodes 27 are provided as being shifted downward from the oscillating component 24.

Although not illustrated in the figure, the input electrodes 26 and the output electrodes 27 are supported respectively by the annular wirings 41 and 42 formed on the substrate 22 concentrically with respect to the oscillating component 24, through electroconductive columns 75 similarly to as shown in FIG. 25C. Other aspects of configuration are similar to those in the first embodiment, so any portions corresponded to those in FIGS. 3 and 4 will be given with the same reference numerals, so as to avoid repetitive explanation.

Figure 27:
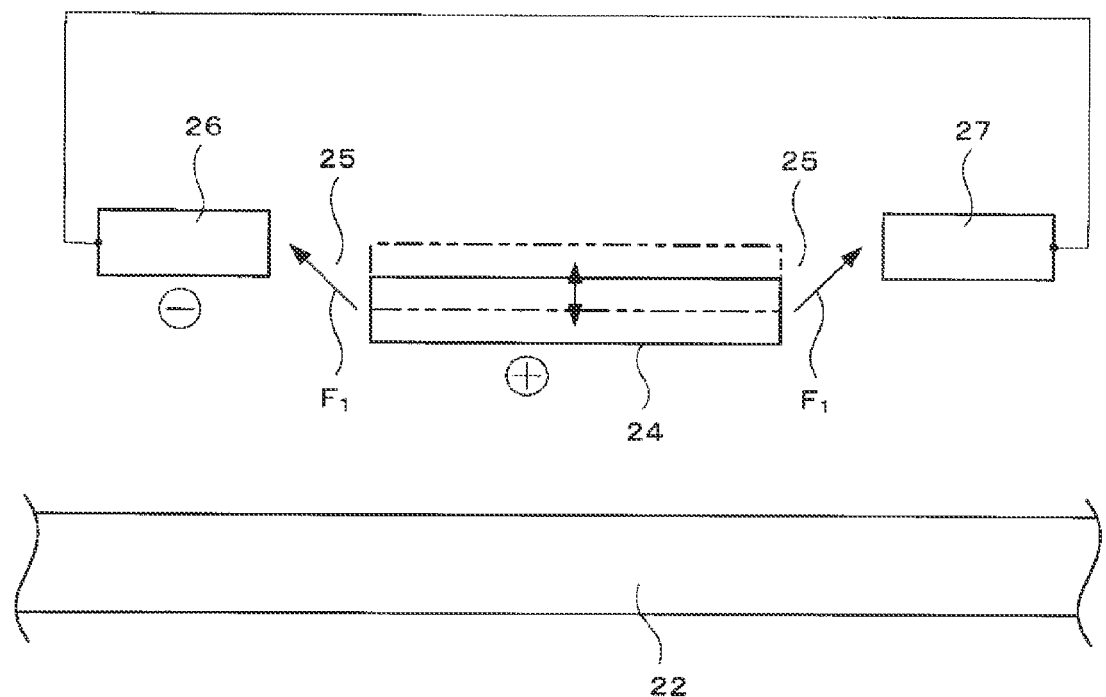
FIG. 27 is a drawing explaining operations of the ninth embodiment.

Also in this resonator 75, the oscillating component 24 raise oscillations at its specific resonance frequency by signals inputted from the input electrodes 26 provided above the oscillating component 24, and the signals are transmitted through the space 25 to the output electrodes 27. More specifically, as shown in FIG. 27, when a signal is inputted to the input electrode 26 so as to produce potential difference between the input electrode 26 and the oscillating component 24, for example, based on assumption that potential of the oscillating component as positive, and potential of the input electrode 26 as negative, force F1 is exerted from the oscillating component 24 to the fixed input electrode 26, and thereby the oscillating component moves right upward. Conversely, when the input electrode 26 has a positive potential and the oscillating component 24 has a negative potential, the force effects in the opposite direction, thereby the oscillating component 24 moves right downward. In this way, the oscillating component 24 oscillates in the vertical direction by input signals.

According to the resonator 75 of the ninth embodiment, an effect of improving the Q-value may be obtained similarly to as described in the above. Similar effects may be obtained also by providing the electrodes 26 and 27 as being opposed to the side faces of the oscillating component 24 while placing the oscillating component 24 in between, with respect to the resonator structure shown in the first to seventh embodiments.

FIGS. 28A to 28C show a tenth embodiment of the resonator according to the present invention, so-called parallel resonator. A resonator 76 of this embodiment is configured by providing the input electrodes 26 and the output electrodes 27 as being opposed to only one side face of the oscillating component 24. Although the example shown in the drawing is configured as providing the input electrodes 26 and the output electrodes 27 as being opposed to the side face of the outer circumferential side of the oscillating component 24, they may be provided at the side face of the inner circumferential side of the oscillating component, as indicated by the chain line. The input electrodes 26 and the output electrodes 27 are provided as being shifted upward from the oscillating component 24 similarly to as shown in FIG. 26, rather than at right beside the oscillating component 24. Although not illustrated in the figure, the input electrodes 26 and the output electrodes 27 may be provided as being shifted downwardly from the oscillating component 24. Although not illustrated in the figure, the input electrodes 26 and the output electrodes 27 are supported respectively by the annular wirings 41 and 42 formed on the substrate 22 concentrically with respect to the oscillating component 24, through electroconductive columns 75 similarly to as shown in FIG. 25C. Other aspects of configuration are similar to those in the ninth embodiment, so any portions corresponded to those in FIGS. 26A to 26C will be given with the same reference numerals, so as to avoid repetitive explanation.

According to the resonator 76 of the tenth embodiment, an effect of improving the Q-value may be obtained similarly to as described in the above. Similar effects may be obtained also by providing the electrodes 26 and 27 as being opposed to only one side face of the oscillating component 24, with respect to the resonator structure shown in the first to seventh embodiments.

FIG. 29A to 29C show an eleventh embodiment of the resonator according to the present invention, so-called parallel resonator. A resonator 77 of this embodiment is configured by providing the input electrodes 26 and the output electrodes 27 as being shifted in the oblique direction from respective side face of the oscillating component 24 while placing the oscillating component 24 in between. In this case, the input electrode 26 and the output electrodes 27 are provided in obliquely shifted manner by sandwiching the oscillating component 24. In other words, in this embodiment, the output electrode 27 is located on the outer circumferential side of the oscillating component as being shifted upward from the oscillating component 24, and the input electrodes 26 are located on the inner circumferential side of the oscillating component as being shifted downward from the oscillating component 24. Other aspects of configuration are similar to those in the eighth and ninth embodiments, so any portions corresponded to those in FIGS. 25A to 25C and in FIGS. 26A to 26C will be given with the same reference numerals, so as to avoid repetitive explanation.

The oscillating component 24 in the resonator 77 of the eleventh embodiment oscillates similarly to as explained referring to FIG. 26.

According to the resonator 77 of the eleventh embodiment, an effect of improving the Q-value may be obtained similarly to as described in the above. Similar effects may be obtained also by providing the electrodes 26 and 27 as being opposed to both side faces of the oscillating component 24 on the inner circumferential side and the outer circumferential side thereof, while placing the oscillating component 24 in between (in other words, as being shifted in the oblique direction) with respect to the resonator structure shown in first to seventh embodiments.

The method of supporting the oscillating component 24 shown in FIG. 15 to FIG. 17 is applicable also to the eighth to eleventh embodiments.

Next, an exemplary method of manufacturing the resonators according to the first embodiment to fourth embodiment will be explained, referring to FIG. 30.

Figure 30A:
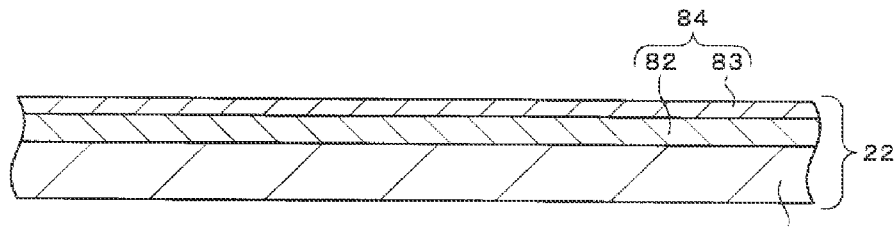
FIGS. 30A to 30E are drawings showing exemplary manufacturing steps adopted to manufacturing of the resonator according to the first to fourth embodiments.

First, as shown in FIG. 30A, a silicon oxide ($SiO_2$) film 82 and a silicon nitride (SiN) film 83, for example, are formed by low-pressure CVD typically on the surface of a silicon semiconductor substrate 81, to form an insulating film 84. The above-described substrate 22 is configured by the semiconductor substrate 81 and the insulating film 84. Double-layered configuration of the insulating film 84 increases thickness of the dielectric film, and successfully reduces parasitic capacitance formed between the silicon substrate 81 and the electrodes on the substrate side. The silicon nitride film 83 serves as an etching stopper when the sacrificial layer, described later, is selectively removed.

Figure 30B:
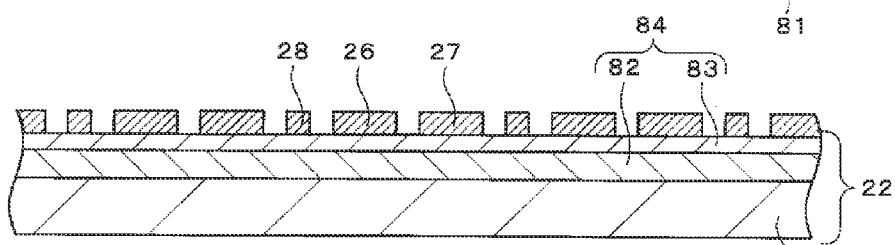

Next, as shown in FIG. 30B, a phosphorus (P)-containing polysilicon film, for example, is formed on the insulating film 84, and the polysilicon film is patterned by lithographic technique and etching technique, thereby the input electrodes 26, the output electrodes 27, and the electroconductive pedestals 28a supporting columns, of the micro-resonators are formed.

Figure 30C:
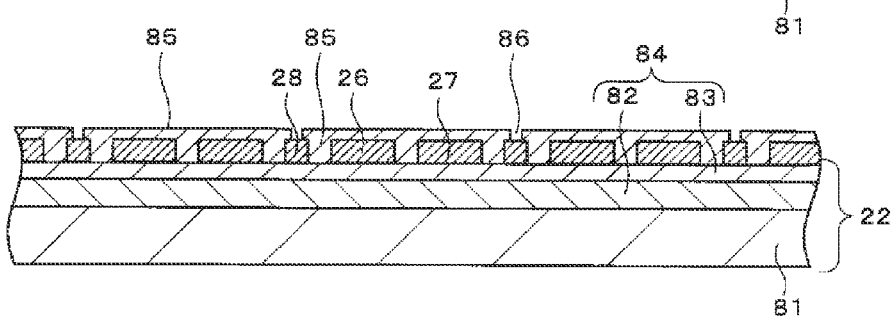

Next, as shown in FIG. 30C, a sacrificial layer 85, which is for example a silicon oxide ($SiO_2$) film, is formed by low-pressure CVD on the surface containing the input electrodes 26, the output electrodes 27 and the pedestals 28, and the sacrificial layer 85 is then planarized by a planarization process such as CMP (chemical mechanical polishing). In this way, the sacrificial layer 85 is formed on the surface of the input/output electrodes 26, 27 and the pedestals 28 at a desired thickness. Thereafter, contact holes 86 reaching to the pedestals 28 which is for columns (so-called anchor portions) are formed in the sacrificial layer 85, using lithographic technique and etching technique.

Figure 30D:
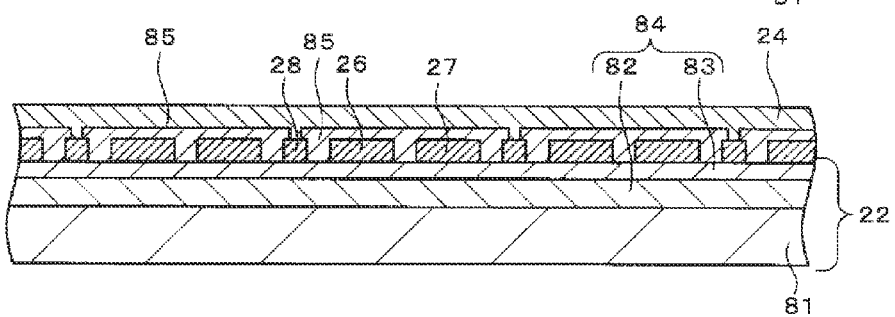

Next, as shown in FIG. 30D, for example, by low-pressure CVD, a polysilicon film doped with an impurity and thereby given with electroconductivity is formed over the sacrificial layer 85 including the contact holes 86. Next, the polysilicon film is patterned using lithographic technique and etching technique, to thereby form the oscillating component 24 and the columns 23.

Figure 30E:
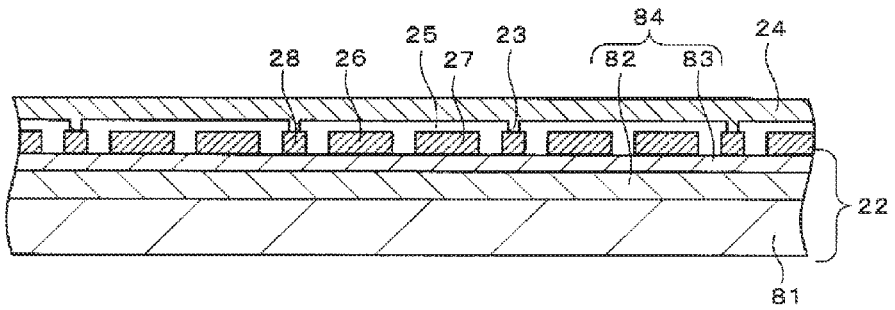

Next, as shown in FIG. 30E, only the silicon oxide film composing the sacrificial layer 85 is selectively removed using an etching solution such as DHF solution, to thereby form the space between the oscillating component 24 and the input/output electrodes 26, 27. By these process steps of manufacturing, the resonator according to the first to fourth embodiments may be manufactured.

The resonators according to the fifth to seventh embodiments may be manufactured by the semiconductor processes similar to those of the resonator in the first to fourth embodiments, by changing position of the pedestals 28 and columns 23, and geometry of the oscillating component 24 by change of the lithographic pattern shown in FIG. 30.

Figure 31A:
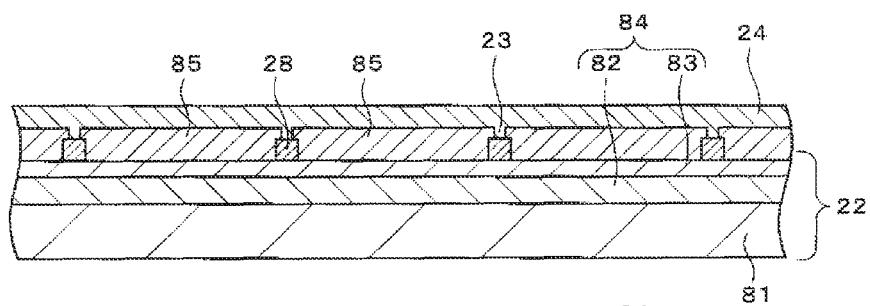
FIGS. 31A to 31C are drawings showing exemplary manufacturing steps adopted to manufacturing of the resonator according to the eighth embodiments.

Next, an exemplary method of manufacturing the resonator 74 according to the eighth embodiment will be explained, referring to FIG. 31. The manufacturing processes up to FIG. 31A are similar with those shown in FIG. 30A to FIG. 30D applied to the above-described first to seventh embodiments.

More specifically, on the surface of the semiconductor substrate 81, the insulating film 84 is formed typically by forming the silicon oxide ($SiO_2$) film 82 and the silicon nitride (SiN) film 83. A phosphorus (P)-containing polysilicon film, for example, is formed on the insulating film 84, and patterned, to thereby form the pedestals 28 supporting the columns of the oscillating component, and the annular wirings 41 and 42 (the geometry of patterning of the polysilicon film herein is different from that shown in FIG. 30B) connecting the individual input electrodes and the individual output electrodes. The sacrificial layer 85 is then formed, and the contact holes 86 reaching to the pedestals 28, which is for columns are formed in the sacrificial layer 85. Thereafter, an electroconductive polysilicon film is formed on the sacrificial layer 85, and the polysilicon film is patterned, to thereby form the oscillating component 24 and the columns 23 for fixing the oscillating component 24 to the pedestals 28.

Figure 31B:
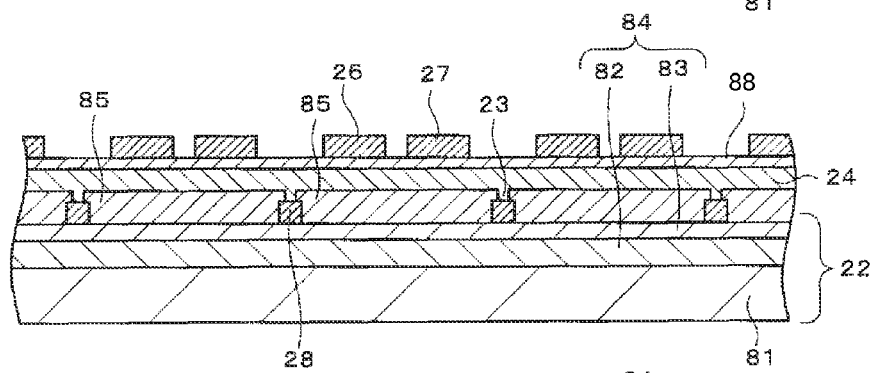

Next, as shown in FIG. 31B, a sacrificial layer 88, for example a silicon oxide ($SiO_2$) film, is formed over the entire surface including the oscillating component 24 and the sacrificial layer 85, by low-pressure CVD. The sacrificial layer 88 is formed on the oscillating component 24 at a desired thickness. Thereafter, contact holes (not shown) reaching to the wirings 41 and 42 which are for forming the columns (so-called anchor portions) of the input electrodes and the output electrodes in the sacrificial layers 85, 88, respectively, using lithographic technique and etching technique. An electroconductive polysilicon film is then formed over the sacrificial layer 88 including the contact holes typically by low-pressure CVD, and patterned using lithographic technique and etching technique, to thereby form the columns (not shown) connected to the wirings 41, 42, and the input electrodes 26 and the output electrodes 27 continued from the top end of the columns.

Figure 31C:
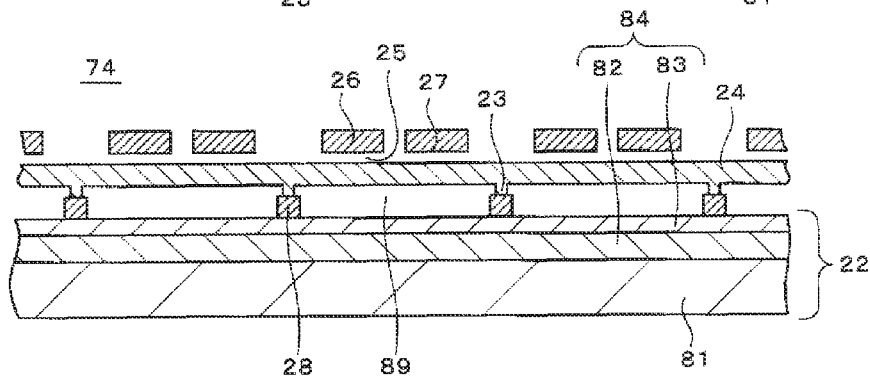

Next, as shown in FIG. 31C, only the sacrificial layers 85, 88 are selectively removed by using an etching solution, such as DHF solution, to thereby form the space 25 between the oscillating component 24 and the input/output electrodes 26 and 27. In this process, also a space 89 is formed between the substrate 22 and the oscillating component 24. In this way, the resonator 74 of the eighth embodiment is manufactured.

Next, an exemplary method of manufacturing the resonator according to the eleventh embodiment will be explained, referring to FIGS. 32A to 33D. FIGS. 32A to 33D correspond to the sectional view shown in FIG. 29C.

Figure 32A:
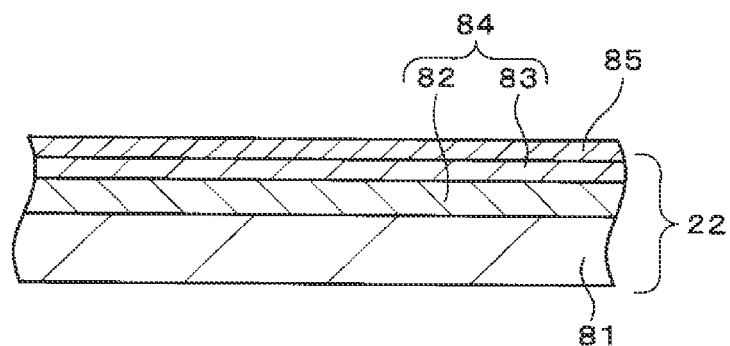
FIGS. 32A to 32E are drawings (series 1) showing process steps of an exemplary method of manufacturing a resonator according to the eleventh embodiment.

First, the processes of manufacturing up to FIG. 32A are similar to those up to forming the sacrificial layer 85 shown in FIG. 30A to FIG. 30C, adopted to the manufacturing in the above-described first to seventh embodiments. More specifically, the insulating film 84 is formed on the surface of the semiconductor substrate 81, typically by forming the silicon oxide ($SiO_2$) film 82 and the silicon nitride (SiN) film 83. A phosphorus (P)-containing polysilicon film, for example, is formed on the insulating film 84, and then patterned, to thereby form the pedestals 28 supporting the columns of the oscillating component, and the annular wirings 41 and 42 for connecting the input electrodes and the output electrodes respectively (a pattern geometry obtained by patterning the polysilicon film herein differs from that shown in FIG. 30B). Next, the sacrificial layer 85 is formed, and the contact holes (not shown) reaching to the wiring 41 of the input electrode which is for forming the columns in the sacrificial layer 85 are formed.

Figure 32B:
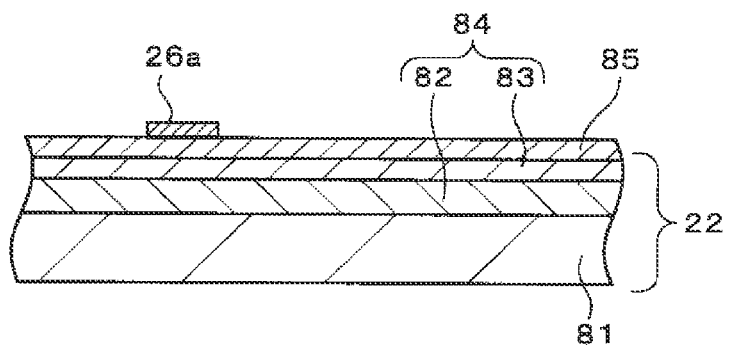

Next, as shown in FIG. 32B, a polysilicon film doped with an impurity and thereby given with electroconductivity is formed on the sacrificial layer 85, typically by low-pressure CVD. The polysilicon is patterned using lithographic technique and etching technique, to thereby form lower portions 26a of the input electrodes 26, and the columns connecting the lower portions 26a of the input electrodes and the wiring 41.

Figure 32C:
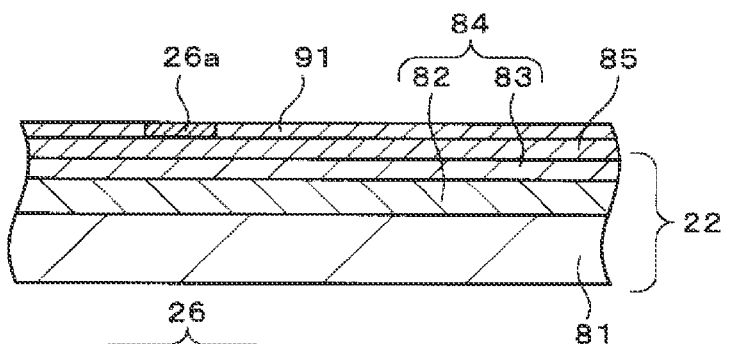

Next, as shown in FIG. 32C, a sacrificial layer 91, which is typically a silicon oxide ($SiO_2$) film, is formed over the entire surface including the lower portions 26a of the input electrodes by low-pressure CVD, and then planarized by a planarization process such as CMP, to a position where the upper surface of the lower portions 26a of the input electrodes is exposed. That is, the sacrificial layer 91 is formed so as to embed the lower portions 26a of the input electrodes. Thereafter the sacrificial layers 91 and 85 are selectively etched off, to thereby form the contact holes reaching to the pedestals 28 (not shown) for formation of the columns of the oscillating component.

Figure 32D:
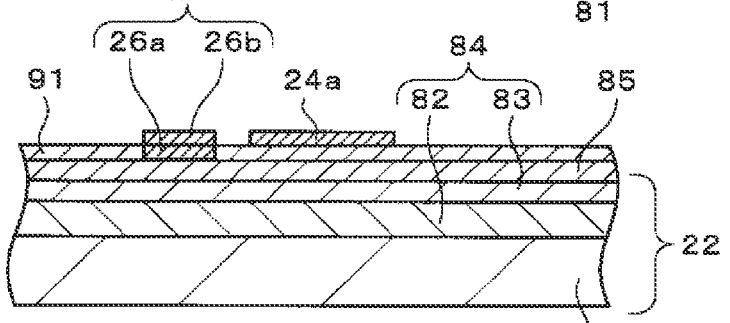

Next, as shown in FIG. 32D, typically by low-pressure CVD, a polysilicon film doped with an impurity and thereby given with electroconductivity is formed over the sacrificial layer 91, plane including the lower portions 26a of the input electrodes. The polysilicon film is patterned using lithographic technique and etching technique, to thereby form upper portions 26b of the input electrodes on the lower portions 26a of the input electrodes, a lower portion 24a of the oscillating component, and columns 23 (not shown) of the oscillating component. The input electrodes 26 are configured by the lower portions 26a of the input electrodes and the upper portions 26b of the input electrodes.

Figure 32E:
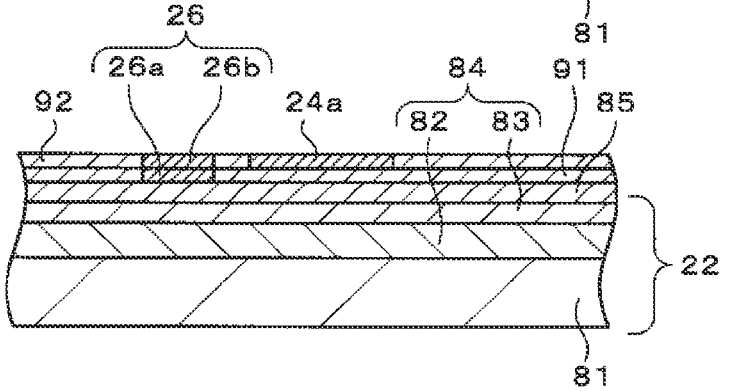

Next, as shown in FIG. 32E, sacrificial layer 92, which is typically a polysilicon oxide ($SiO_2$) film, is formed over the entire surface including the input electrodes 26 and the lower portion 24a of the oscillating component, by low-pressure CVD and is then planarized by a planarization process such as CMP, so as to expose the upper surfaces of the input electrodes 24, and the lower portion 24a of the oscillating component. Thereafter, the sacrificial layers 92, 91 and 85 are selectively etched off, to thereby form the contact holes reaching to the wiring 42 (now shown) which is for formation of the columns of the output electrodes.

Figure 33A:
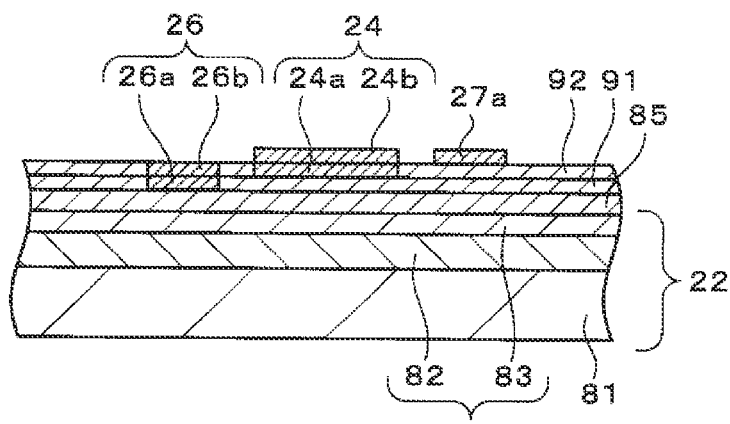
FIGS. 33A to 33D are drawings (series 2) showing exemplary process steps of a method of manufacturing a resonator according to the eleventh embodiment.

Next, as shown in FIG. 33A, an upper portion 24b of the oscillating component 24, lower portions 27a of the output electrodes 27, and the columns (not shown) of the output electrodes are formed, similarly to as in the process shown in FIG. 32D, using a polysilicon film doped with an impurity and thereby given with electroconductivity. The oscillating component 24 is configured by the lower portion 24a of the oscillating component and the upper portion 24b of the oscillating component.

Figure 33B:
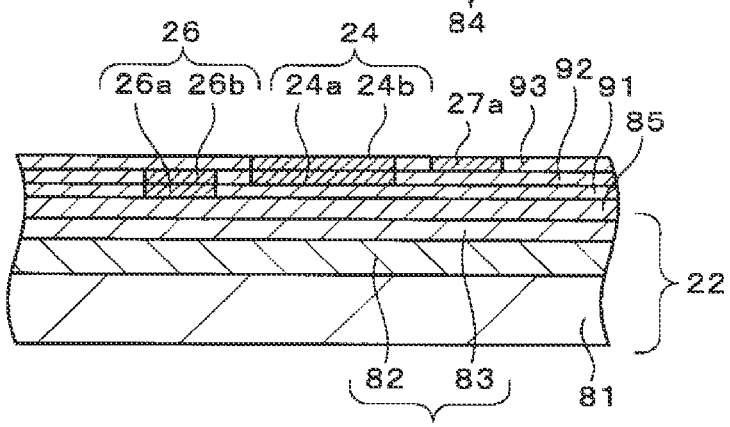

Next, as shown in FIG. 33B, a sacrificial layer 93 is formed so as to embed the oscillating component 24 and the lower portions 27a of the output electrodes, while leaving the upper surfaces thereof are exposed, similarly to as in the process shown in FIG. 32E.

Figure 33C:
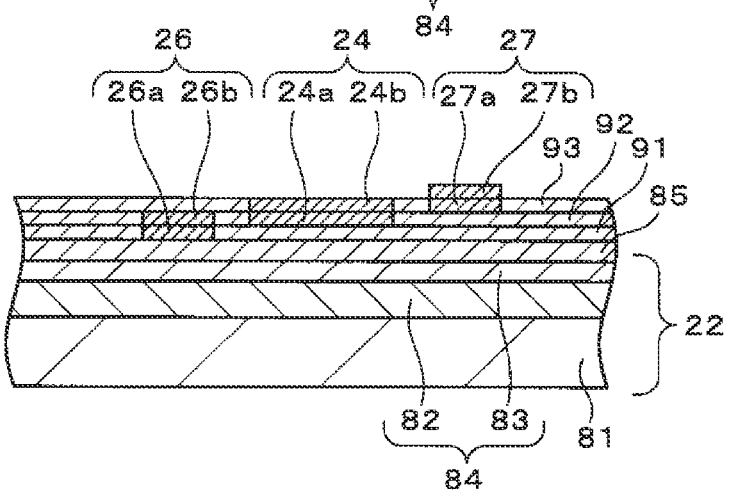

Next, as shown in FIG. 33C, upper portions 27b of the output electrodes are formed using a polysilicon film doped with an impurity and thereby given with electroconductivity, similarly to as in the process shown in FIG. 33A. The output electrodes 27 are configured by the lower portions 27a of the output electrodes and the upper portions 27b of the output electrodes.

Figure 33D:
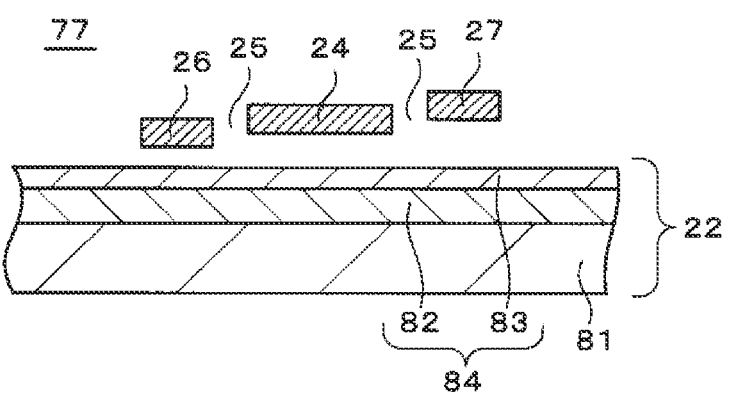

Next, as shown in FIG. 33D, only silicon oxide film in the sacrificial layers 93, 92, 91 and 85 is selectively removed using an etching solution such as DHF solution, to thereby form the space 25 between the oscillating component 24 and the input/output electrodes 26 and 27. The resonator 77 of the eleventh embodiment is manufactured in this way.

Also the resonator 75 of the ninth embodiment and the resonator 76 of the tenth embodiment may be manufactured basically conforming to the method of manufacturing the resonator 77 of the eleventh embodiment described in the above.

By arranging a plurality of resonator elements annularly in line to form a closed system, and by arranging the oscillating component as being continuously integrated so as to allow it to oscillate under a mode of higher degree as a whole, according to the resonators of the individual embodiments described in the above, the structure of the individual resonator elements is equalized, and stress exerted to the oscillating component of the individual resonator elements is equalized. By virtue of this configuration, variation in the characteristics of the individual unit resonator elements in the parallel resonator may be reduced, lowering of the Q-value ascribable to the parallel configuration may be suppressed, and the Q-value equivalent to that expectable from the unit resonator may be obtained. It may be even possible to obtain the Q-value larger than that expectable from the unit resonator, because kinetic energy of the oscillating component leaking through the support components to the substrate is reduced.

According to the embodiments of the present invention, the parallel resonators having large Q-value may be manufactured, and RF elements such as oscillator, filter, mixer and so forth having high function, may be configured using the parallel resonator. Also devices, communication devices, may be configured using the RF elements.

In particular, the parallel resonator of the embodiment is preferably applied to oscillators. The oscillators of the embodiment may configure oscillators excellent in stability of frequency.

The embodiments of the present invention may provide communication devices which communicate making use of electromagnetic wave, such as mobile phone, wireless LAN instrument, wireless transceiver, television tuner and radio tuner, configured by using the oscillators based on the resonators according to the above-described embodiments.

Next, an exemplary configuration of communication device applied with the oscillator of the above-described embodiment of the present invention will be explained, referring to FIG. 34.

First, a configuration of the sender system will be explained. An I-channel sending signal and a Q-channel sending signal are supplied from a baseband block 230 to a multipliers 201I and 201Q, respectively. Each of the multipliers 201I and 201Q multiplies two signals derived from oscillation output of an oscillator 221 after being subject to predetermine phase shift by a phase shifter 202, and the multiplied signals are then mixed to produce a single series of signal. The mixed signal is then supplied via a variable amplifier 203 and a band pass filter 204 to a multiplier 205, wherein the output of an oscillator 222 is multiplied, and is then converted in frequency to be adjusted to frequency for sending. Output of the multiplier 205 is supplied via a band pass filter 206, a variable amplifier 207 and a power amplifier 208, to an antenna 210 connected to a duplexer 209, and subjected to wireless sending from the antenna 210. At the band pass filters 204 and 206, frequency components other than those of the sending signal are removed. The duplexer 209 is a divider which supplies signals having a frequency for sending from the sender system to the antenna side, and supplies signals having a frequency for receiving from the antenna side to the receiver system.

In the receiver system, the signal received by the antenna 210 is supplied via the duplexer 209 to a low-noise amplifier 211, and an amplified output of the low-noise amplifier 211 is supplied to a multiplier 213. In the multiplier 213, output of the oscillator 222 is multiplied, and the signal having a frequency for receiving is converted to a signal having an intermediate frequency. Thus converted signal having an intermediate frequency is then supplied via a band pass filter 214 to two multipliers 215I and 215Q. Each of the multipliers 215I and 215Q multiplies two signals derived from oscillation output of the oscillator 221 after being subject to predetermined phase shift by a phase shifter 216, to thereby obtain an I-channel received signal, and a Q-channel received signal. The thus obtained I-channel received signal and the Q-channel received signal are supplied to the baseband block 230. The band pass filters 212 and 214 remove frequency components other than those of the signal.

The oscillators 221 and 222 are configured so that oscillation frequency is controlled by a control unit 223, and is given as a PLL (Phase Locked Loop) circuit. The control unit 223 has, arranged therein, a filter, a comparator and so forth necessary as the PLL circuit.

Figure 34:
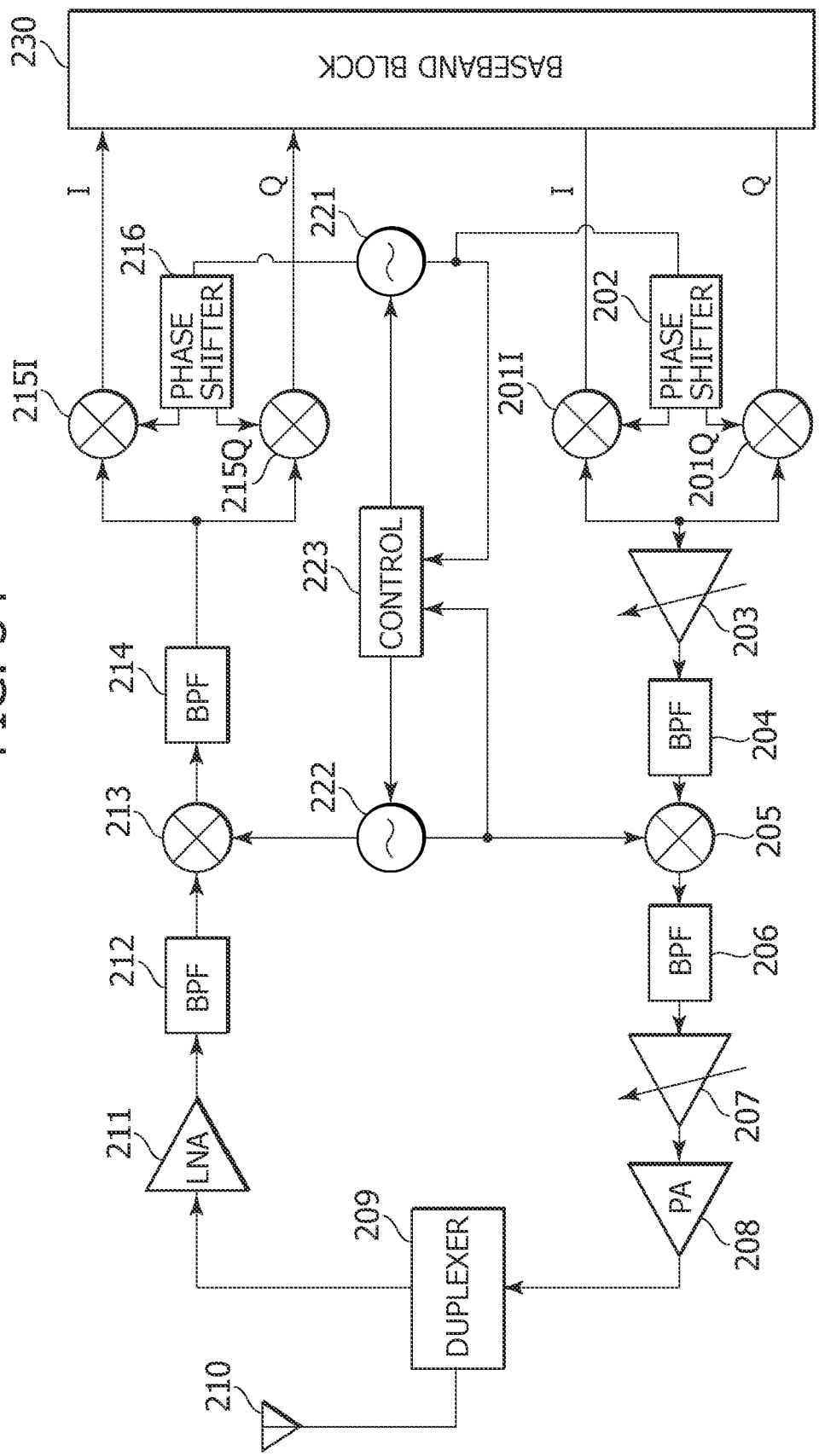
FIG. 34 is a circuit diagram showing an embodiment of a communication device according to the present invention.
Figure 35A:
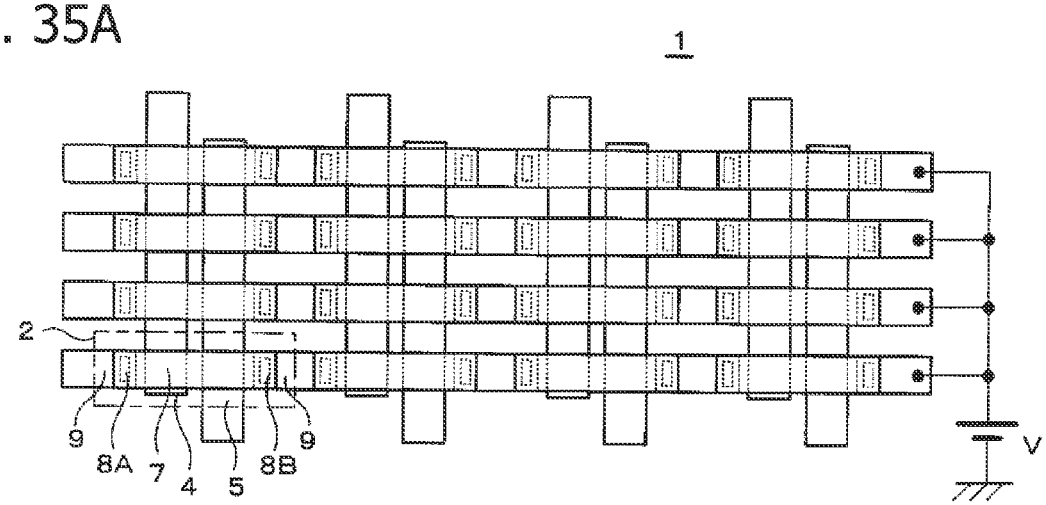
FIGS. 35A and 35B are a schematic plan view and a sectional view, respectively, of an exemplary arrayed parallel resonator.
Figure 35B:
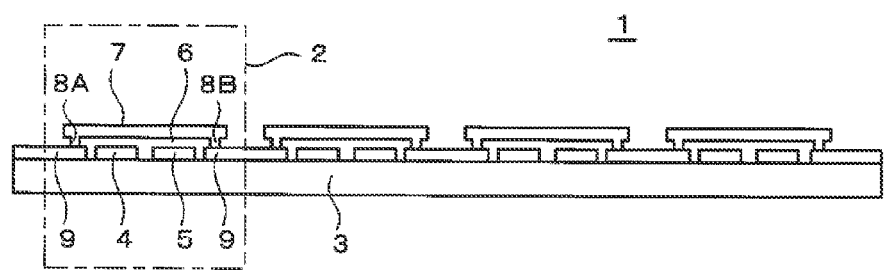
Figure 36:
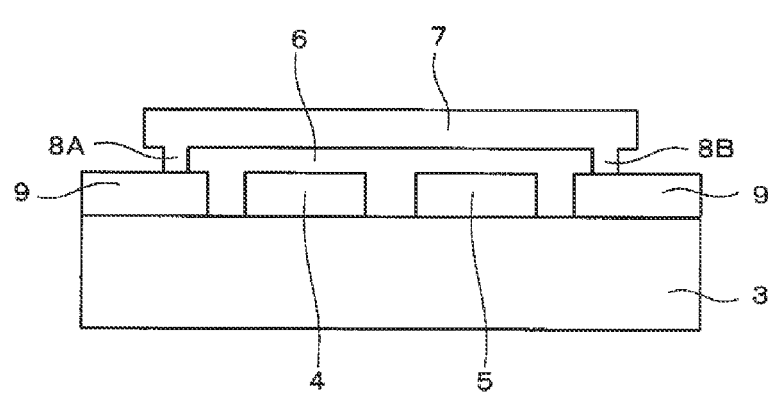
FIG. 36 is a sectional view showing an exemplary unit resonator element of the parallel resonator shown in FIG. 35.

In thus-configured communication device shown in FIG. 34, as the oscillators 221 and 222, the oscillators configured as described in the embodiments may be applied.

According to the communication device of the present invention, provided with the oscillator by the parallel resonator having a large Q-value, oscillator characteristics excellent in the frequency stability may be obtained, and thereby a highly-reliable communication device may be provided.

FIG. 34 exemplified the case where the present invention is applied to an oscillator in a communication device taking parts in wireless sending and wireless receiving, whereas the present invention may be applicable to an oscillator in a communication device taking parts in sending and receiving via wired transmission path, and further a resonator of the embodiments may be applicable to an oscillator owned by an communication device taking part in sending only, or by an communication device taking part in receiving only. The present invention is adoptable still also to an oscillator in need of other instruments which handle high frequency signals.

It should be understood by those skilled in the art that various modifications, combinations, sub-combinations and alterations may occur depending on design requirements and other factors insofar as they are within the scope of the appended claims or the equivalents thereof.

What is claimed is:

1. A resonator comprising a plurality of resonator elements, each resonator element respectively having (a) an electrode, (b) an associated oscillating component transverse to the electrode, each oscillating component being a beam supported at both ends thereof and (c) a space between the electrode and the oscillating component, wherein, the plurality of resonator elements are annularly arranged and form a closed system, each electrode extends lengthwise in a radial direction, the electrode being between the substrate and the associated oscillating component, the oscillating components of the plurality of resonator elements are continuously formed in an integrated manner, and a structure of the individual resonator elements is equalized, and stress applied to the individual resonator elements is equalized.

2. The resonator as claimed in claim 1, wherein the plurality of resonator elements are point symmetrically arranged with respect to the center of the closed system.

3. The resonator as claimed in claim 2, wherein the plurality of resonator elements are annularly arranged according to a circular or polygonal shape.

4. The resonator as claimed in claim 1, wherein the closed oscillating component is formed as to keep antinode-to-antinode distance and node-to-node distance of oscillation constant.

5. The resonator as claimed in claim 1, wherein a length of the closed oscillating component is an integral multiple of a wavelength of oscillation.

6. The resonator as claimed in claim 1, wherein support components of the oscillating component are provided at the nodes of oscillation.

7. The resonator as claimed in claim 6, wherein the support components of the oscillating component are provided under the oscillating component.

8. The resonator as claimed in claim 7, wherein the support components of the oscillating component are provided at all nodes of oscillation with respect to an annular oscillating component.

9. The resonator as claimed in claim 7, wherein the support components of the oscillating component are provided at every other node of oscillation with respect to an annular oscillating component.

10. The resonator as claimed in claim 6, wherein the support components of the oscillating component are provided on the side faces of the oscillating component.

11. The resonator as claimed in claim 10, wherein the support components of the oscillating component are provided at all nodes of oscillation with respect to both side faces on the inner circumference side and outer circumference side of an annular oscillating component.

12. The resonator as claimed in claim 10, wherein the support components of the oscillating component are provided at every other node of oscillation with respect to both side faces on the inner circumference side and outer circumference side of an annular oscillating component.

13. The resonator as claimed in claim 10, wherein the support components of the oscillating component are provided at alternate nodes of oscillation with respect to both side faces on the inner circumference side and outer circumference side of the annular oscillating component.

14. The resonator as claimed in claim 10, wherein the support components are formed continuously and integrally at the outer side of the oscillating component.

15. The resonator as claimed in claim 14, wherein the support components are formed on the same plane with the oscillating component.

16. The resonator as claimed in claim 14, wherein the support components contacting the oscillating component have a square sectional form.

17. The resonator as claimed in claim 1, wherein the electrodes of the resonator are provided in the upper, lower, lateral or oblique direction of the oscillating component.

18. The resonator as claimed in claim 1, wherein the electrodes of the resonator are positioned to correspond to the antinodes of the oscillating component.

19. An oscillator configured by using a resonator, the resonator comprising a plurality of resonator elements, each resonator element respectively having (a) an electrode, (b) an associated oscillating component transverse to the electrode, each oscillating component being a beam supported at both ends thereof and (c) space between the electrode and the oscillating component,
wherein,
the plurality of resonator elements are annularly arranged and form a closed system,
each electrode extends lengthwise in a radial direction, the electrode being between the substrate and the associated oscillating component,
the oscillating components of the plurality of resonator elements are continuously formed in an integrated manner, and
a structure of the individual resonator elements is equalized, and stress applied to the individual resonator elements is equalized.

20. A communication device having an oscillator circuit for frequency conversion, configured using an oscillator, the oscillator comprising:
a plurality of resonator elements, each resonator element respectively having:
an electrode,
an associated oscillating component transverse to the electrode, each oscillating component is a beam supported at both ends thereof, and
a space in between the electrode and the oscillating component,
wherein,
the plurality of resonator elements are annularly arranged and form a closed system,
each electrode extends lengthwise in a radial direction, the electrode being between the substrate and the associated oscillating component,
the oscillating component of the plurality of resonator elements is continuously formed in an integrated manner, and
a structure of the individual resonator elements is equalized, and stress applied to the individual resonator elements is equalized.

* * * * *